US012796205B2

(12) United States Patent
Chae et al.

(10) Patent No.: US 12,796,205 B2

(45) Date of Patent: Nov. 10, 2026

(54) FABRICATING TANDEM SOLAR CELL DEVICES USING DEVICE-LEVEL ENCAPSULATION

(71) Applicant: Applied Materials, Inc., Santa Clara, CA (US)

(72) Inventors: Yongkee Chae, San Ramon, CA (US); Yong Jin Kim, Albany, CA (US); Cheng-Pei Ouyang, Gilroy, CA (US); Su-Ho Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/649,730

(22) Filed: Apr. 29, 2024

(65) Prior Publication Data

US 2024/0381675 A1 Nov. 14, 2024

Related U.S. Application Data

(60) Provisional application No. 63/464,985, filed on May 9, 2023.

(51) Int. Cl.

*H10K 39/15* (2026.01)
*H10K 30/57* (2023.01)
*H10K 30/88* (2023.01)
*H10K 39/10* (2026.01)

(52) U.S. Cl.

CPC ............ *H10K 39/15* (2023.02); *H10K 30/57* (2023.02); *H10K 30/88* (2023.02); *H10K 39/10* (2023.02)

(58) Field of Classification Search

None

See application file for complete search history.

(56) References Cited

U.S. PATENT DOCUMENTS

| | | | | |
|---|---|---|---|---|
| 5,389,159 | A * | 2/1995 | Kataoka | H10F 77/169 438/57 |
| 11,864,399 | B1 * | 1/2024 | Leijtens | H10K 30/10 |
| 2007/0295385 | A1 * | 12/2007 | Sheats | H10F 77/1696 136/251 |
| 2010/0078075 | A1 * | 4/2010 | Tsukahara | B82Y 10/00 136/263 |
| 2010/0229921 | A1 | 9/2010 | Farris, III et al. | |
| 2012/0067717 | A1 | 3/2012 | Dietrich et al. | |
| 2012/0125437 | A1 * | 5/2012 | Okawara | H10K 30/88 136/259 |

(Continued)

FOREIGN PATENT DOCUMENTS

| | | | | |
|---|---|---|---|---|
| GB | 2574808 | A * | 12/2019 | H02S 30/20 |
| JP | H10335683 | A * | 12/1998 | |

(Continued)

OTHER PUBLICATIONS

Machine translation of WO2023/037326A1 (Year: 2023).*

(Continued)

*Primary Examiner* — Ryan S Cannon

(74) *Attorney, Agent, or Firm* — Lowenstein Sandler LLP

(57) ABSTRACT

A method includes obtaining a set of tandem solar cell devices, and forming, on each tandem solar cell device of the set of tandem solar cell devices using a deposition process, a discrete encapsulation layer along an upper surface and side surfaces of the tandem solar cell device.

14 Claims, 21 Drawing Sheets

(56) References Cited

U.S. PATENT DOCUMENTS

| | | | | |
|---|---|---|---|---|
| 2013/0196483 | A1* | 8/2013 | Dennard | H01L 21/76254 257/E21.211 |
| 2013/0228452 | A1 | 9/2013 | De Bosscher | |
| 2019/0006547 | A1* | 1/2019 | Watts | B32B 17/10036 |
| 2020/0411709 | A1* | 12/2020 | Einav | H10F 77/16 |
| 2021/0036174 | A1* | 2/2021 | Bullen | H10F 19/80 |
| 2023/0006158 | A1* | 1/2023 | Griffith | H10F 19/804 |
| 2023/0092881 | A1 | 3/2023 | Lee et al. | |
| 2023/0103676 | A1 | 4/2023 | Lifka et al. | |
| 2024/0090246 | A1* | 3/2024 | Kim | H10K 30/57 |

FOREIGN PATENT DOCUMENTS

| | | | | |
|---|---|---|---|---|
| JP | 2012074365 A | 4/2012 | | |
| KR | 20170133566 A | 12/2017 | | |
| KR | 20220139497 A | 10/2022 | | |
| WO | 2020221415 A1 | 11/2020 | | |
| WO | 2022069050 A1 | 4/2022 | | |
| WO | 2022194377 A1 | 9/2022 | | |
| WO | 2022223096 A1 | 10/2022 | | |
| WO | WO-2023037326 A1 * | 3/2023 | | H10F 10/19 |

OTHER PUBLICATIONS

Machine translation of JPH10-335683A (Year: 1998).*

Wang, Yantao, et al., ACS Materials, "Encapsulation and Stability Testing of Perovskite Solar Cells for Real Life Applications", ACS Mater. AU 2022, 2, 215-236, https://doi.org/10.1021/acsmaterialsau.1c00045.

Reddy, Sathy Harshavardhan, et al., ACS Applied Materials & Interfaces, "Holistic Approach toward a Damage-Less Sputtered Indium Tin Oxide Barrier Layer for High-Stability Inverted Perovskite Solar Cells and Modules", ACS Appl. Mater. Interfaces 2022, 14, 51438-51448, https://doi.org/10.1021/acsami.2c10251.

Lei, Hao, et al., Transaction of the Materials Research Society of Japan 34[2] 321-324 (2009), "Low Damage Sputter Deposition of ITO Films on Organic Light Emitting Films", 4 pages, (Accepted Feb. 26, 2009).

Linss, Volker, et al., Research Article | Aug. 27, 2019, AIP Conference Proceedings 2147, 040009 (2019), "Comparison of low damage sputter deposition techniques to enable the application of very thin a-Si passivation films", https://doi.org/10.1063/1.5123836, 8 pages.

Smirnov, Yury, et al., Royal Society of Chemistry, "Wafer-scale pulsed laser deposition of ITO for solar cells: reduced damage vs. interfacial resistance", Mater. Adv., 2022, 3, 3469, Accepted Feb. 28, 2022, DOI: 10.1039/d1ma01225h, rsc.li/materials-advances, 5 pages.

International Search Report and Written Opinion for International Application No. PCT/US2024/027849, mailed Aug. 19, 2024, 09 pages.

International Search Report and Written Opinion for International Application No. PCT/US2024/027859, mailed Aug. 26, 2024, 09 pages.

* cited by examiner

FABRICATING TANDEM SOLAR CELL DEVICES USING DEVICE-LEVEL ENCAPSULATION

CROSS-REFERENCE TO RELATED APPLICATION(S)

The present application claims priority to U.S. Provisional Patent Application No. 63/464,985, filed on May 9, 2023 and entitled "FABRICATING TANDEM SOLAR CELL DEVICES USING DEVICE-LEVEL ENCAPSULATION", the entire contents of which are hereby incorporated by reference herein.

TECHNICAL FIELD

Embodiments of the present disclosure relate to electronic device fabrication generally. Particularly, embodiments of the present disclosure relate to fabricating tandem solar cell devices using device-level encapsulation.

BACKGROUND

Solar cell devices are devices that convert sunlight into energy by harnessing the photoelectric effect. Solar cells can be made of semiconducting materials that absorb photons from sunlight and use them to create an electric current. Solar cell devices are commonly used in solar panels, which are used to generate electricity from sunlight for homes, businesses, and other applications.

SUMMARY

According to embodiments described herein is a method. The method includes obtaining a set of tandem solar cell devices, forming, on each tandem solar cell device of the set of tandem solar cell devices using a deposition process, a discrete encapsulation layer along an upper surface and side surfaces of the tandem solar cell device.

According to embodiments described herein is a device. The device includes a set of tandem solar cell devices, each tandem solar cell device of the set of tandem solar cell devices including a first solar cell, a second solar cell, a recombination layer disposed between the first solar cell and the second solar cell, a first set of electrodes disposed on the first solar cell, and a second set of electrodes disposed on the second solar cell. The device further includes, for each tandem solar cell device of the set of tandem solar cell devices, a discrete encapsulation layer disposed on an upper surface and side surfaces of the tandem solar cell device.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
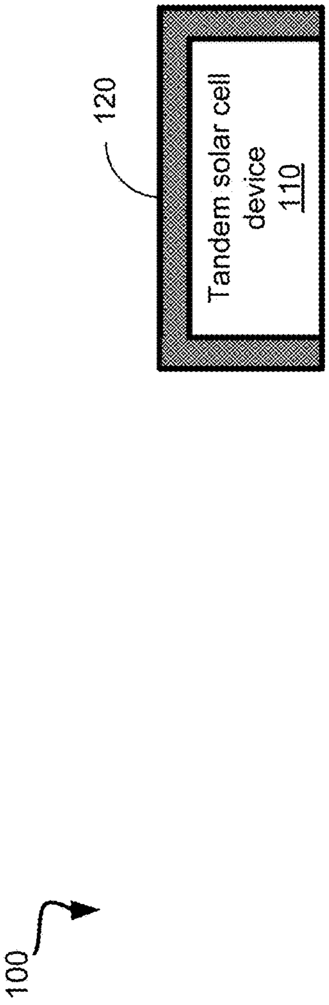
FIG. 1 is a diagram of an example device with device-level encapsulation, in accordance with some embodiments.

Embodiments described herein relate to fabricating tandem solar cell devices using device-level encapsulation. A tandem solar cell device is a device including a stack of at least two solar cells. Each solar cell of the tandem solar cell device can be designed to capture a different portion of the solar spectrum, allowing for a higher overall efficiency as compared to single-cell solar cell devices. The top solar cell can be made of a semiconductor material with a wider bandgap, allowing it to capture photons having wavelengths from the blue end of the electromagnetic spectrum (e.g., having wavelengths between about 380 nanometers (nm) to about 500 nm). The bottom sub-cell can be made of a semiconductor material with a narrower bandgap, allowing it to capture photons having wavelengths from the red end of the electromagnetic spectrum (e.g., having wavelengths between about 625 nm to about 740 nm).

In some embodiments, a tandem solar cell device is a two-cell device including a first solar cell and a second solar cell disposed on the first solar cell. For example, the first solar cell can be a bottom solar cell and the second solar cell can be a top solar cell. A first set of electrodes can be formed on the first solar cell and a second set of electrodes can be formed on the second solar cell. Each electrode can be formed from any suitable material in accordance with embodiments described herein. For example, the first set of electrodes and the second set of electrodes can include silver (Ag) electrodes.

In some embodiments, the tandem solar cell device further includes a recombination layer disposed between the first solar cell and the second solar cell to facilitate recombination of electrons and holes. Recombination between an electron and a hole occurs when the electron and the hole recombine with each other instead of being collected at the respective electrodes to generate electrical current. In some embodiments, the recombination layer includes a transparent conductive oxide (TCO) layer. TCOs are materials that can conduct electricity while remaining optically transparent. TCOs can be formed from a base material including a metal oxide, such as zinc oxide (ZnO), tin oxide ($SnO_2$), etc., that have been doped with impurities such as Sn, indium (In), etc., to create free electrons that enable electricity conduction. Examples of TCOs include indium zinc oxide (IZO), indium tin oxide (ITO), indium cerium oxide (ICO), aluminum-doped zinc oxide (AZO), etc. The doping process does not significantly affect the optical properties of the base material, and thus maintains their transparency properties. As a result, TCOs can transmit light in various regions of the electromagnetic spectrum (e.g., visible and near-infrared regions), making them useful for electronic device applications where transparency may be advantageous. For example, TCOs can be used in the fabrication of various types of electronic devices, such as touch screens, flat panel displays, photovoltaic devices (e.g., solar cells and image sensors), lighting devices, etc. In addition to their optical and electrical properties, TCOs can also exhibit high chemical stability and durability, which makes them suitable for use in harsh environments.

In some embodiments, the recombination layer includes at least one polycrystalline material. A polycrystalline material is a material including multiple crystal grains (in contrast to a monocrystalline material). In some embodiments, a polycrystalline material is a nanocrystalline material. A nanocrystalline material is a polycrystalline material including individual crystal grains having a size on the scale of nanometers. More specifically, a polycrystalline material can be a doped (e.g., heavily doped) polycrystalline material. For example, a polycrystalline material can be a p-type doped polycrystalline material or an n-type doped polycrystalline material. In some embodiments, the recombination layer includes at least one polycrystalline silicon (Si) material. For example, the recombination layer can include at least one p-type doped polycrystalline Si material, at least one n-type doped polycrystalline Si material, etc.

In some embodiments, the recombination layer includes at least two polycrystalline materials. More specifically, the recombination layer can include a p-type doped (or heavily doped) polycrystalline material and an n-type doped (or heavily doped) polycrystalline material. For example, the recombination layer can include a p-type doped polycrystalline Si material and an n-type doped polycrystalline Si material.

In some embodiments, the first solar cell is a heterojunction (HJT) solar cell. More specifically, an HJT solar cell can include a stack of alternating semiconductor layers of a semiconductor material disposed on a TCO layer. An HJT interface is defined at the boundary region where a respective pair of semiconductor layers of the stack meet, which can form an electric field that facilitates the separation and collection of electron-hole pairs. The first set of electrodes can be disposed on the TCO layer of the HJT solar cell.

Each semiconductor layer of the stack is formed from a different type of semiconductor material. For example, an HJT solar cell can include a first semiconductor layer including a doped semiconductor material. The first semiconductor layer can be disposed on a second semiconductor layer including an intrinsic semiconductor material. The second semiconductor layer can be disposed on a third semiconductor layer including a doped semiconductor material. The third semiconductor layer can be disposed on a fourth semiconductor layer including an intrinsic semiconductor material. The fourth semiconductor layer can be disposed on a fifth semiconductor layer including a doped semiconductor material. The fifth semiconductor layer can be disposed on the TCO layer of the HJT solar cell. In some embodiments, the first semiconductor layer and the third semiconductor layer each include an n-type semiconductor material and the fifth layer includes a p-type semiconductor material. In some embodiments, the first semiconductor layer and the third semiconductor layer each include a p-type semiconductor material and the fifth layer includes an n-type semiconductor material.

In some embodiments, each semiconductor layer of the stack includes silicon (Si). For example, the first semiconductor layer can be a first amorphous Si (a-Si) layer, the second semiconductor layer can be a first intrinsic Si (i-Si) layer, the third semiconductor layer can be a crystalline Si (c-Si) layer (e.g., monocrystalline Si or polycrystalline Si), the fourth semiconductor layer can be a second i-Si layer, and the fifth semiconductor layer can be a second a-Si layer. In some embodiments, the first a-Si layer and the c-Si layer are each n-type layers (i.e., n-a-Si and n-c-Si) and the second a-Si layer is a p-type layer (i.e., p-a-Si). In some embodiments, the first a-Si layer and the c-Si layer are each p-type layers (i.e., p-a-Si and p-c-Si) and the second a-Si layer is an n-type layer (i.e., n-a-Si).

In some embodiments, the second solar cell includes a TCO layer disposed on a stack including an electron transport layer (ETL) disposed on an active layer. The function of the ETL is to collect electrons that are generated when sunlight is absorbed by the active layer, and transport the electrons to the electrode of the solar cell. Thus, the ETL can improve the efficiency of electron transport from the active layer to an external circuit. The ETL can include a material selected to enable electron transport. Examples of materials that can be used to form ETLs include titanium dioxide ($TiO_2$), ZnO, $SnO_2$, etc. In some embodiments, the ETL functions as a barrier layer to prevent the diffusion of impurities between the electrode and the active layer, which can improve stability and longevity of the solar cell. The second set of electrodes can be disposed on the TCO layer of the second solar cell.

In some embodiments, the second solar cell is a perovskite solar cell. More specifically, the active layer of the solar cell can include a perovskite layer including a perovskite material, and the ETL can be disposed on the perovskite layer. A perovskite material has a crystal structure with the chemical formula $ABX_3$, where A and B are cations (i.e., positively charged ions) and X is an anion (i.e., negatively charged ion). A perovskite material can have a set of properties (e.g., bandgap) that enables absorption of solar radiation and generation of a larger number of electron-hole pairs, which can be separated and collected to generate an electrical current. One example of a perovskite material is methylammonium lead triiodide ($CH_3NH_3PbI_3$). The active layer can be disposed on a hole transport layer (HTL) that can extract and transport holes (i.e., positive charges). The HTL can be formed from a material that has high hole mobility to enable transport of holes. For example, the HTL can be formed from a nickel oxide (e.g., $NiO_x$), a molybdenum oxide ($MoO_x$), a vanadium oxide ($VO_x$), a tungsten oxide ($WO_x$), a copper oxide ($CuO_x$ or $Cu_xO$), a copper gallium oxide ($CuGaO_x$), a copper aluminum oxide ($CuAlO_x$), a copper chromium oxide (e.g., $CuCrO_x$), ZnO, an aluminum nickel oxide ($Al_yNi_{1-y}O_x$), spiro-OMeTAD (2,2',7,7'-tetrakis(N,N-di-p-methoxyphenylamine)-9,9'-spirobifluorene), poly(3,4-ethylenedioxythiophene) (PEDOT), etc. Accordingly, a tandem solar cell device can be a perovskite/HJT tandem solar cell device.

In some embodiments, the first solar cell includes a TCO layer disposed on a stack including an ETL disposed on an active layer. For example, the first solar cell can be a perovskite solar cell. Accordingly, the tandem solar cell device can be a perovskite/perovskite tandem solar cell device.

In some embodiments, the tandem solar cell device is a triple-cell device. More specifically, the tandem solar cell can include a first solar cell, a second solar cell disposed on the first solar cell, and a third solar cell disposed on the second solar cell. For example, the first solar cell can be an HJT solar cell, and the second and third solar cell can each include a TCO layer disposed on a stack including an ETL disposed on an active layer (e.g., a perovskite solar cell). Accordingly, the tandem solar cell device can be a perovskite/perovskite/HJT tandem solar cell device.

Some tandem solar cell devices, such a tandem solar cell device including a solar cell having ETLs disposed on active layers, can suffer from performance and/or efficiency degradation if the active layer is exposed to atmospheric conditions (e.g., moisture and/or oxygen). For example, an active layer can be a perovskite layer. Encapsulation techniques can be used to improve long-term stability and extend the lifetime of such tandem solar cell devices. Some approaches to encapsulation are module-level with respect to a module of tandem solar cell devices. Generally, a module refers to an assembly of multiple solar cell devices that work together to generate electricity from sunlight. For example, a module can be embodied as a solar panel.

Some modules can be encapsulated using glass-to-glass encapsulation. Glass-to-glass encapsulation includes encapsulating a module using two sheets of glass with an encapsulant. The glass sheets can be formed from a glass material that is resistant to breakage and can withstand various temperatures and weather conditions, such as tempered glass. The encapsulant between the glass sheets can provide adhesion and protect the solar cells of the module from air and moisture. In some implementations, the encapsulant can include a polymer material. For example, the polymer material can include ethylene vinyl acetate (EVA), polyisobutylene (PIB), butyl rubber, an epoxy resin, etc.

Water vapor is a primary factor that degrades the performance of some solar cells (e.g., perovskite solar cells). Water vapor transmission rate (WVTR) is a measure of the amount of water vapor that passes through a material over a period of time. That is, the WVTR of a material is a metric related to the ability of the material to function as a barrier against water. A higher WVTR means that the material is more permissible to water vapor, which can lead to electronic device degradation. Some module-level encapsulation methods, such as glass-to-glass encapsulation, can enable WVTRs that range from about $10^{-1}$ grams per square meter per day ($g/m^2$/day) to about $10^{-3}$ $g/m^2$/day (e.g., measured at a temperature of about 85° C.±10% and a humidity of about 85%±10%). However, components such as perovskite layers may have lower WVTR specifications of less than or equal to about $10^{-3}$ $g/m^2$/day that cannot be realized by using module-level encapsulation such as glass-to-glass encapsulation. Additionally, the efficiency of solar cells that employ module-level encapsulation (e.g., glass-to-glass encapsulation) can be shown during temperature cycle testing to rapidly degrade over time.

To address these and other drawbacks, embodiments described herein provide for fabrication of tandem solar cell devices using device-level encapsulation. A tandem solar cell device described herein can include any number of solar cells in accordance with embodiments described herein. In some embodiments, a tandem solar cell device is a two-cell device including a first solar cell and a second solar cell disposed on the first solar cell. A recombination layer can be disposed between the first solar cell and the second solar cell. For example, a tandem solar cell device can be a perovskite/HJT tandem solar cell device, a perovskite/perovskite tandem solar cell device, etc. In some embodiments, a tandem solar cell device is a triple cell device including a first solar cell, a second solar cell disposed on the first solar cell, and a third solar cell disposed on the second solar cell. For example, a tandem solar cell device can be a perovskite/perovskite/HJT tandem solar cell device.

At least one device-level encapsulation layer can be performed to encapsulate at least one tandem solar cell device, respectively. A device-level encapsulation layer is a discrete encapsulation layer formed on a respective tandem solar cell device. More specifically, a device-level encapsulation layer is a discrete encapsulation layer formed along an upper surface and side surfaces of a respective tandem solar cell device. For example, a device-level encapsulation layer is a layer of encapsulation material that is conformally deposited along the upper and side surfaces of a respective tandem solar cell device.

A device-level encapsulation layer can be used to protect the active layer of a solar cell of a tandem solar cell device (e.g., perovskite layer) to air and moisture conditions. The device-level encapsulation layer can be formed from a material that provides a suitably low WVTR to protect the active layer from moisture. In some embodiments, the device-level encapsulation layer provides a WVTR that is greater than $10^{-3}$ $g/m^2$/day (e.g., measured at a temperature of about 85° C.±10% and a humidity of about 85%±10%). Examples of materials that can be used to form the device-level encapsulation layer include aluminum oxide ($Al_2O_3$), silicon nitride ($SiN_x$), silicon oxynitride (SiON), silicon carbonitride (SiCN), hexamethyldisiloxane (HMDSO), etc. In some embodiments, a device-level encapsulation layer is formed using thin film encapsulation (TFE). TFE can be performed to form the encapsulation layer using any suitable deposition process. In some embodiments, TFE is performed using chemical vapor deposition (CVD).

In some embodiments, the at least one tandem solar cell device includes a plurality of solar cell devices. A module can be formed from the plurality of tandem solar cell devices, in which each tandem solar cell device is electrically connected. In some embodiments, module-level encapsulation can be performed to encapsulate, in addition to the device-level encapsulation performed to encapsulate each tandem solar cell device within the module (i.e., a hybrid encapsulation method). In some embodiments, performing module-level encapsulation includes performing glass-to-glass encapsulation. Further details regarding fabricating tandem solar cell devices using device-level encapsulation will now be described below with reference to FIGS. 1-7.

FIG. 1 is a block diagram of an example device 100 with device-level encapsulation, in accordance with some embodiments. As shown, device 100 includes tandem solar cell device 110. Tandem solar cell device 110 can include at least a first solar cell and a second solar cell. In some embodiments, tandem solar cell device 110 is a two-cell device. For example, the first solar cell can be a bottom solar cell and the second solar cell can be a top solar cell. In some embodiments, a recombination layer is disposed between the first solar cell and the second solar cell. In some embodiments, the first solar cell includes a stack of alternating semiconductor layers. In some embodiments, the first solar cell is an HJT solar cell. In some embodiments, the second solar cell includes a stack of layers including an ETL disposed on an active layer. In some embodiments, the second solar cell is a perovskite solar cell and the active layer is a perovskite layer. In some embodiments, tandem solar cell device 110 is a triple cell device including a first solar cell, a second solar cell and a third solar cell. Further details regarding the structure and fabrication of tandem solar cell device 110 will be described below with reference to FIGS. 4-9I.

As further shown, device 100 further includes encapsulation layer 120. Encapsulation layer 120 is a device-level encapsulation layer that can be used to protect components of tandem solar cell device 110 including the active layer (e.g., perovskite layer) of the second solar cell from moisture and/or air conditions. Encapsulation layer 120 is a discrete encapsulation layer formed on tandem solar cell device 110. More specifically, encapsulation layer 120 is a discrete encapsulation layer formed along an upper surface and side surfaces of tandem solar cell device 110. For example, as shown, encapsulation layer 120 is a layer of encapsulation material that is conformally deposited along the upper and side surfaces of tandem solar cell device 110. For example, as shown, encapsulation layer 120 can be conformally deposited along the upper and side surfaces of tandem solar cell device 110.

Encapsulation layer 120 can be formed from a material that provides a suitably low WVTR to protect the active layer from moisture. In some embodiments, encapsulation layer 120 provides a WVTR that is greater than $10^{-3}$ $g/m^2$/day. Examples of materials that can be used to form encapsulation layer 120 include $Al_2O_3$, $SiN_x$, SION, SiCN, HMDSO, etc. In some embodiments, encapsulation layer 120 is formed using TFE. TFE can be performed to form encapsulation layer 120 using any suitable deposition process. In some embodiments, TFE is performed using CVD. Further details regarding fabricating device 100 will be described below with reference to FIGS. 4A-9I.

Figure 2:
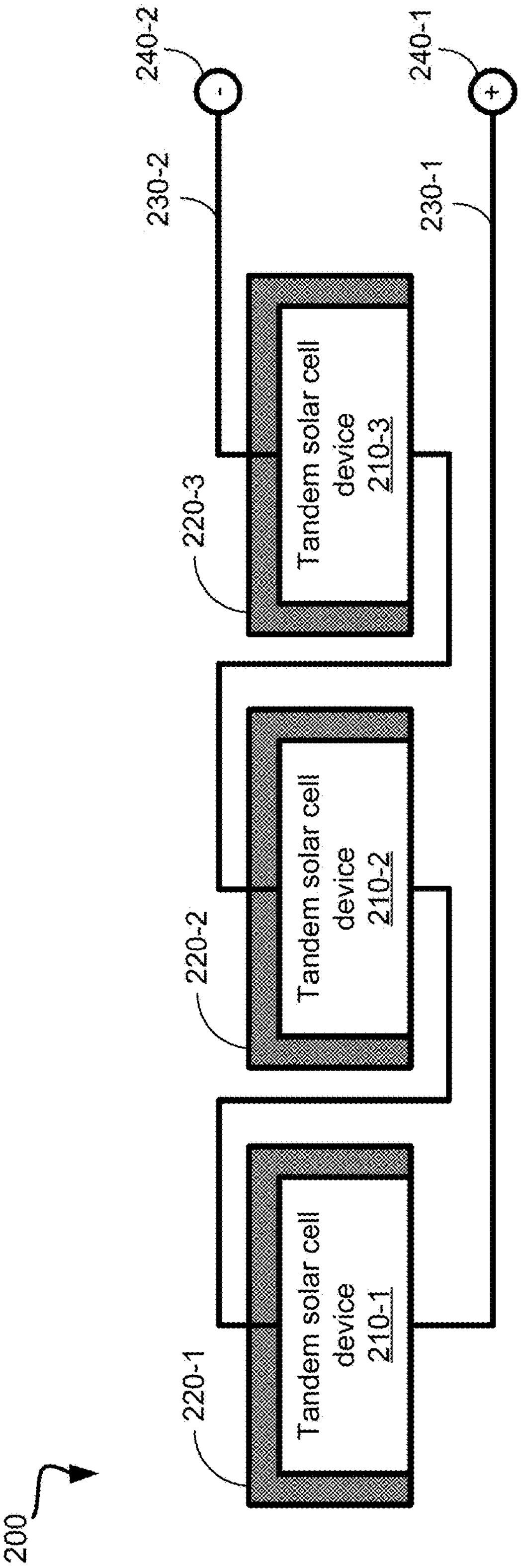
FIG. 2 is a diagram of an example module of tandem solar cell devices with device-level encapsulation, in accordance with some embodiments.

FIG. 2 is a block diagram of an example module 200 of tandem solar cells with device-level encapsulation, in accordance with some embodiments. As shown, module 200 can include a plurality of tandem solar cell devices including tandem solar cell devices 210-1 through 210-3, and a plurality of encapsulation layers including encapsulation layers 220-1 through 220-3 formed on respective ones of tandem solar cell devices 210-2 through 210-3. For example, each of tandem solar cell devices 210-1 through 210-3 can be similar to tandem solar cell device 110 of FIG. 1, and each of encapsulation layers 220-1 through 220-3 can be a device-level encapsulation layer similar to encapsulation layer 120 of FIG. 1. In this illustrative example, module 200 includes three tandem solar cell devices. However, module 200 can include any suitable number of tandem solar cell devices in accordance with embodiments described herein. As further shown, module 200 can further include electrical connections among the tandem solar cell devices 210-1 through 210-3. In this example, electrical connection 230-1 can be formed to connect tandem solar cell device 210-1 to positive terminal 240-1. Additionally, electrical connection 230-2 can be formed to connect tandem solar cell devices 210-1 through 220-3 to negative terminal 240-2.

Figure 3:
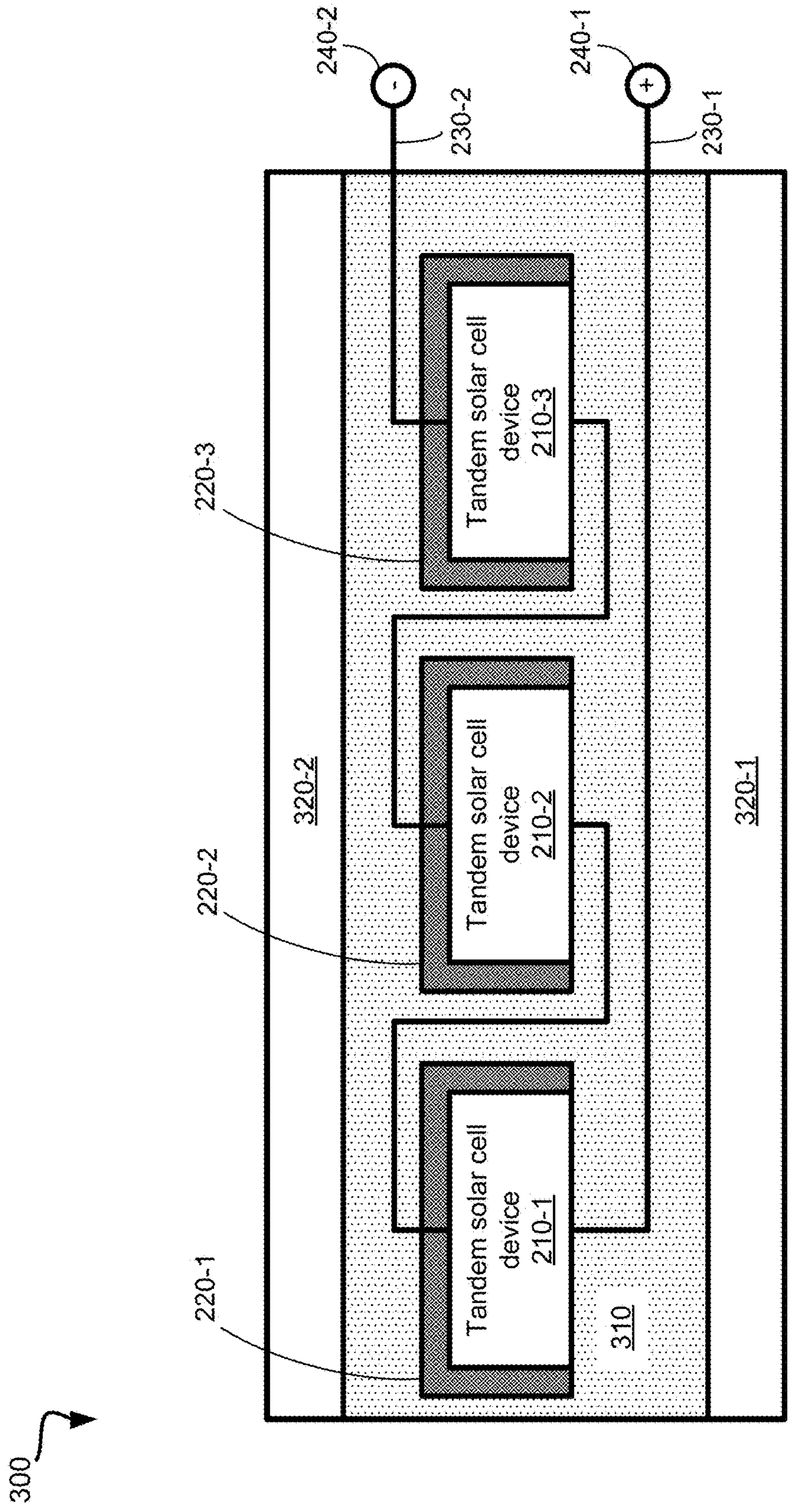
FIG. 3 is a diagram of an example module of tandem solar cell devices with device-level encapsulation and module-level encapsulation, in accordance with some embodiments.

FIG. 3 is a diagram of an example module 300 of tandem solar cell devices with distinct device-level encapsulation and module-level encapsulation, in accordance with some embodiments. Module 300 includes tandem solar cells 210-1 through 210-3, encapsulation layers 220-1 through 220-3, electrical connections 230-1 and 230-2, and terminals 240-1 and 240-2 as described above with reference to FIG. 2. In addition to the device-level encapsulation provided by encapsulation layers 220-1 through 220-3, module 300 includes module-level encapsulation. More specifically, module 300 includes encapsulant 310 and glass layers 320-1 and 320-2. In some embodiments, encapsulant 310 includes a polymer material. For example, the polymer material can include EVA, PIB, butyl rubber, an epoxy resin, etc. In some embodiments, glass layers 320-1 and 320-2 include tempered glass.

Figure 4A:
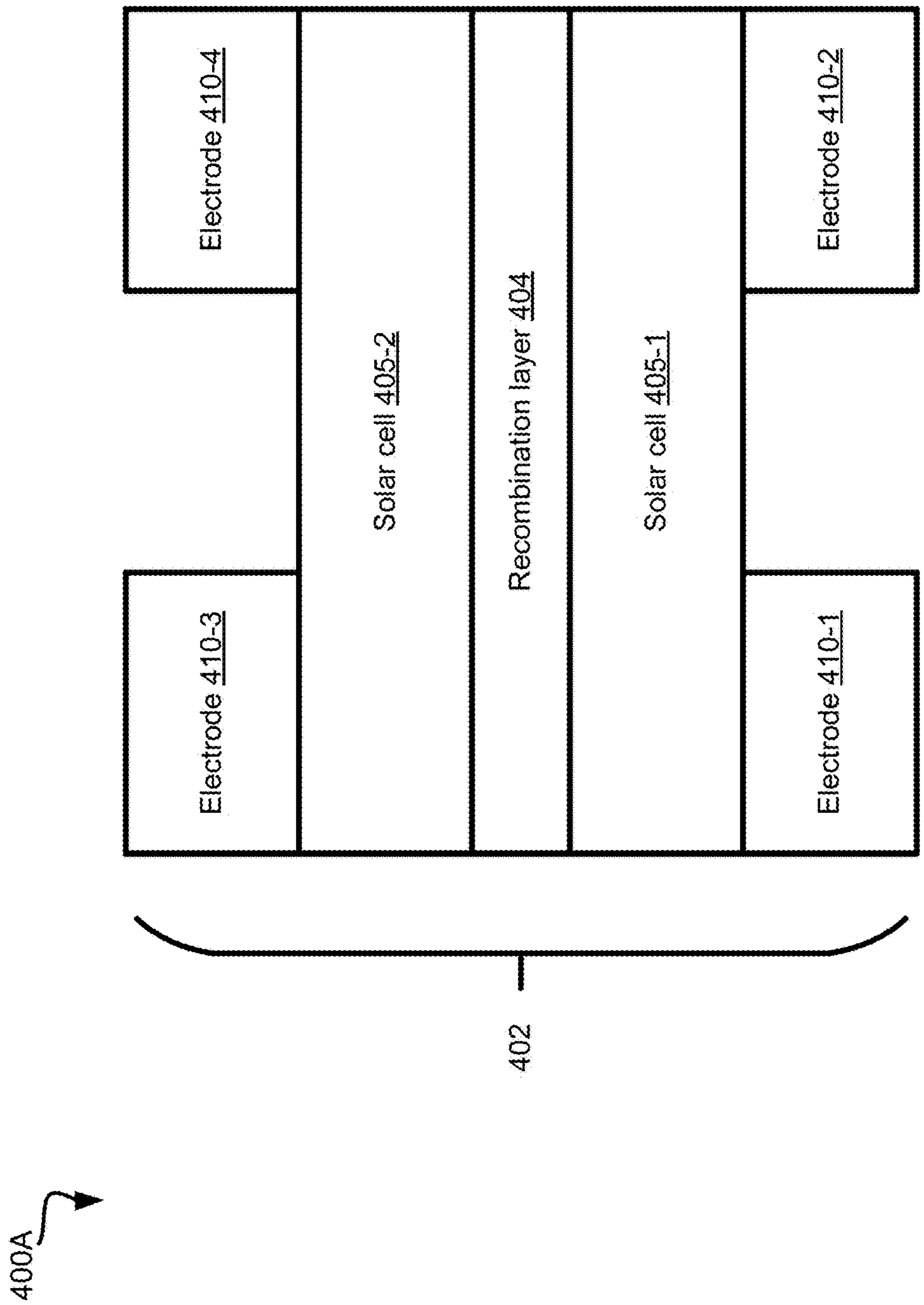
FIGS. 4A-4D are diagrams illustrating the fabrication of a tandem solar cell device using device-level encapsulation, in accordance with some embodiments.

FIGS. 4A-4D are diagrams of cross-sectional views illustrating the fabrication of a tandem solar cell device using device-level encapsulation, in accordance with some embodiments. For example, FIG. 4A is a diagram 400A illustrating tandem solar cell device 402. For example, tandem solar cell device 402 is an example of tandem solar cell device 110 of FIG. 1 and/or an example of at least one of tandem solar cell devices 210-1 through 210-3 of FIGS. 2-3.

As shown, tandem solar cell device 402 can include solar cell 405-1 and solar cell 405-2, recombination layer 404 disposed between solar cell 405-1 and solar cell 405-2, electrodes 410-1 and 410-2 disposed on solar cell 405-1, and electrodes 410-3 and 410-4 disposed on solar cell 405-2. Recombination layer 404 can facilitate recombination of electrons and holes. In some embodiments, recombination layer 404 is a TCO layer. For example, recombination layer 404 can include ITO, IZO, ICO, AZO, etc. Electrodes 410-1 through 410-4 can include any suitable material. For example, electrodes 410-1 through 410-4 can include Ag. In some embodiments, solar cell 405-1 includes a stack of alternating semiconductor layers. For example, solar cell 405-1 can be an HJT solar cell. Further details regarding solar cell 405-1 will be described below with reference to FIG. 5. In some embodiments, solar cell 405-2 includes a stack including an ETL disposed on an active layer. For example, solar cell 405-2 can be a perovskite solar cell and the active layer can be a perovskite layer. Further details regarding solar cell 405-2 will be described below with reference to FIG. 6.

Figure 4B:
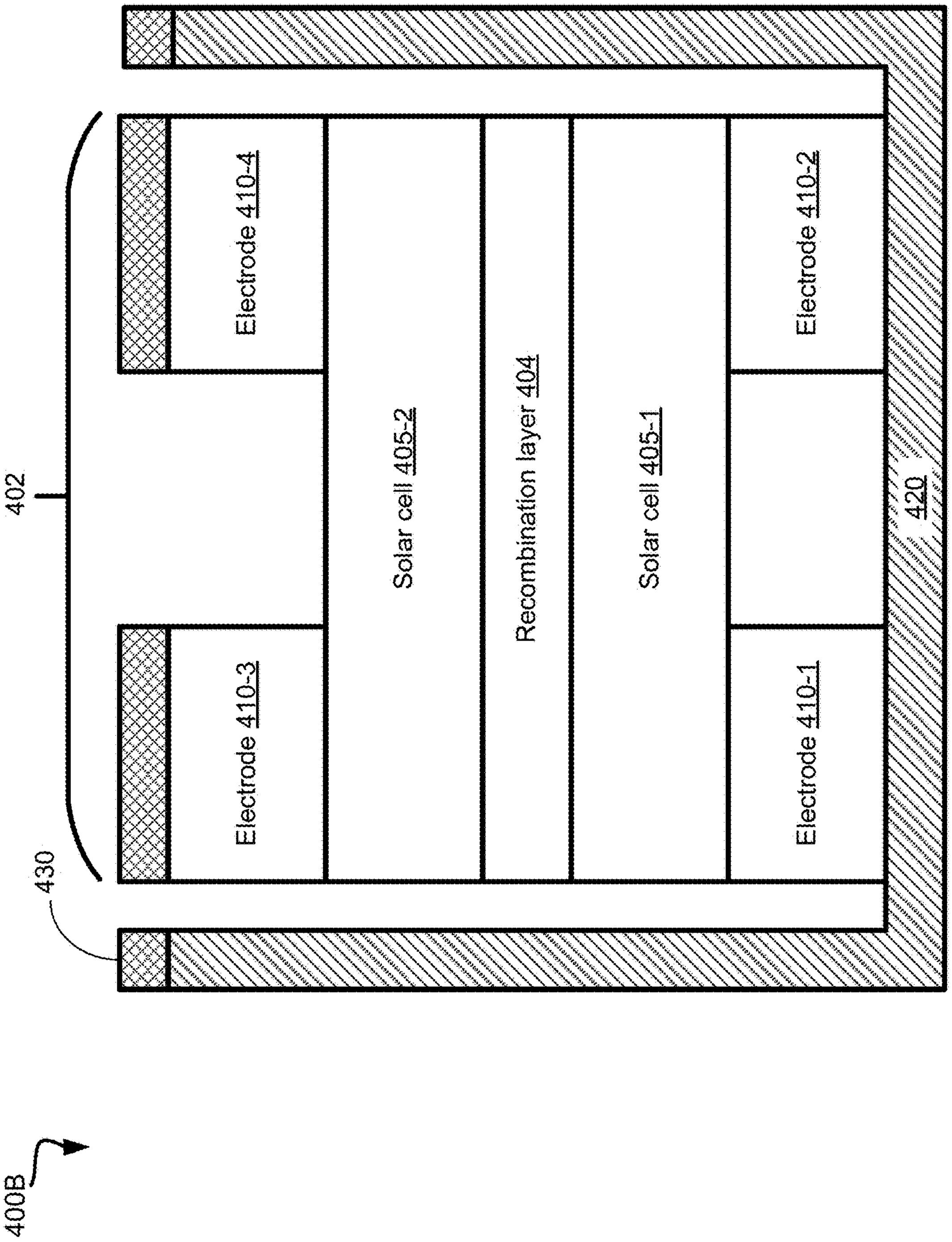

FIG. 4B is a diagram 400B illustrating the placement of tandem solar cell device 402 within tray 420 within a processing chamber, and the formation of mask layers 430 on the upper surfaces of electrodes 410-3 and 410-4 and tray 420. In some embodiments, tray 420 is a CVD tray and the processing chamber is a CVD chamber. Mask layers 430 can include any suitable material that can prevent the formation of encapsulation layer material on the upper surface of electrodes 410-3 and 410-4 and tray 420. In some embodiments, mask layers 430 correspond to a self-aligned mask. A self-aligned mask is designed to align itself to a substrate during a deposition process. This can be done by using a set of alignment marks on the mask and substrate that are precisely positioned relative to each other.

Figure 4C:
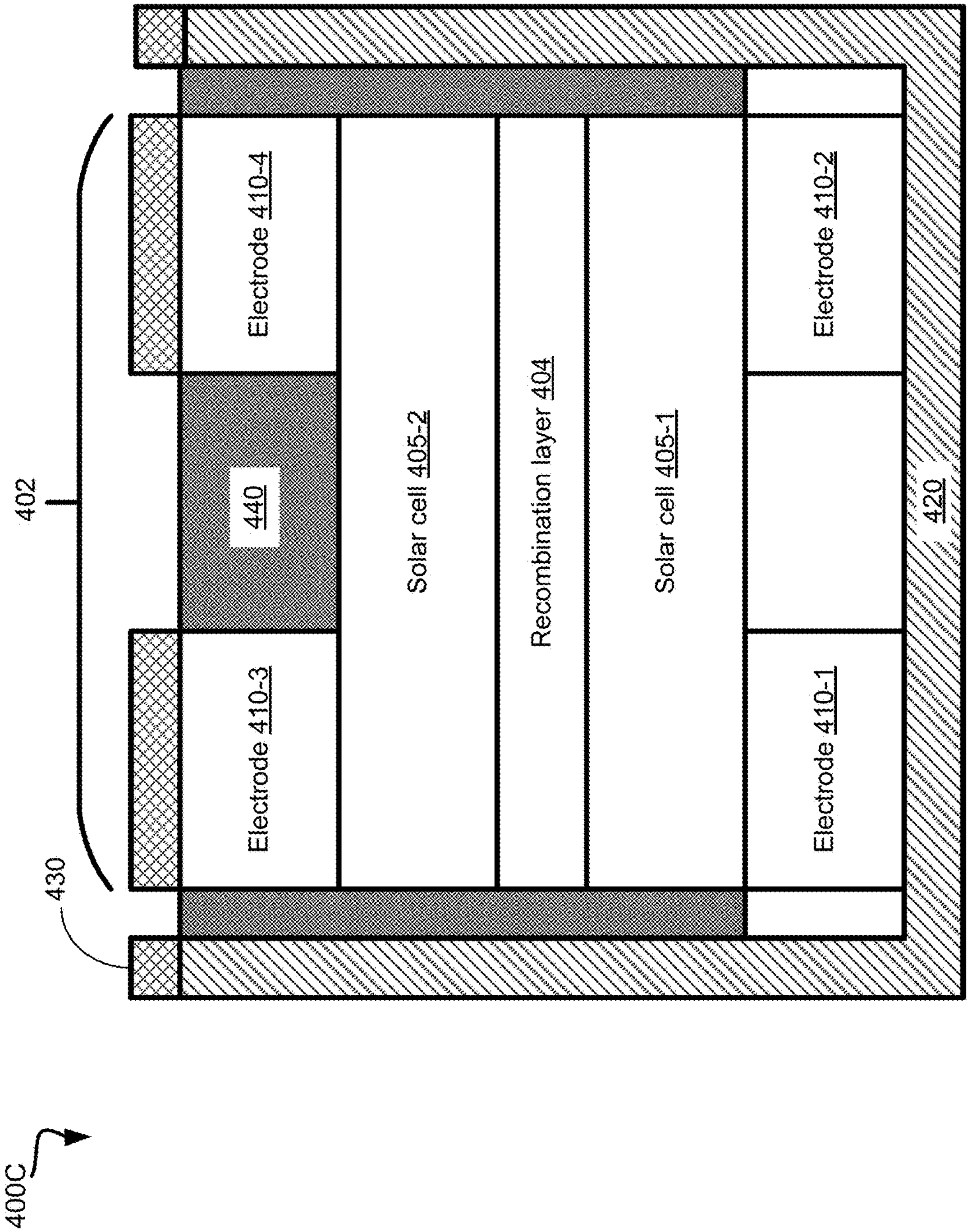
Figure 4D:
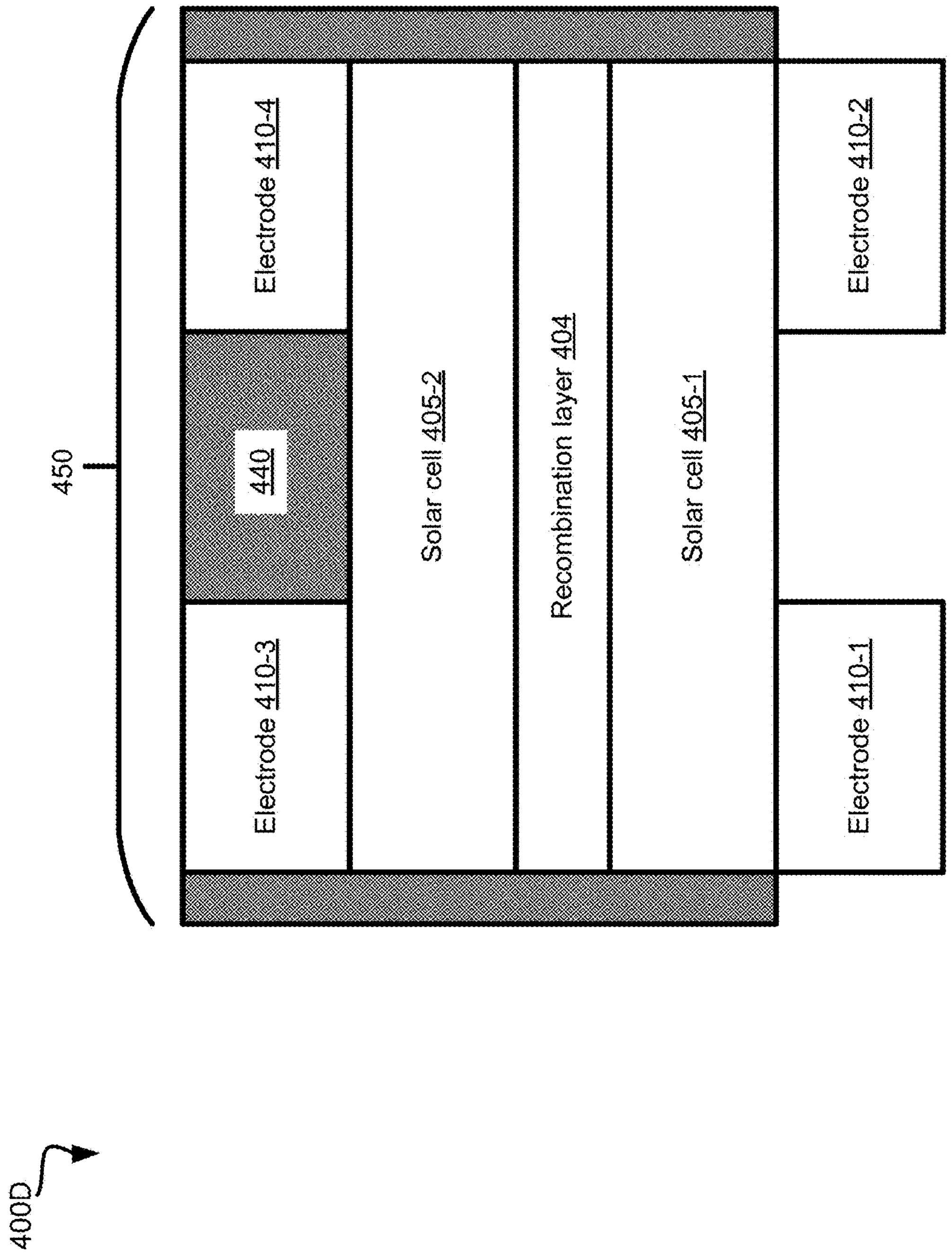

FIG. 4C is a diagram 400C illustrating the formation of encapsulation layer 440 within the processing chamber, and FIG. 4D is a diagram 400D illustrating the removal of mask layers 430 after the forming of encapsulation layer 440, resulting in encapsulated tandem solar cell device 450. More specifically, encapsulation layer 440 provides device-level encapsulation of tandem solar cell device 402. For example, as shown, encapsulation layer 440 can be formed on the top and side surfaces of tandem solar cell device 402. Encapsulation layer 440 can be formed from a material that provides a suitably low WVTR to protect the active layer from moisture. In some embodiments, encapsulation layer 440 provides a WVTR that is greater than $10^{-3}$ $g/m^2$/day. Examples of materials that can be used to form encapsulation layer 440 include $Al_2O_3$, $SiN_x$, SiON, SiCN, HMDSO, etc. In some embodiments, encapsulation layer 440 is formed using TFE. TFE can be performed to form encapsulation layer 440 using any suitable deposition process. In some embodiments, TFE is performed using CVD.

In some embodiments, multiple device-level encapsulation layers including encapsulation layer 440 are formed as separate encapsulation layers on respective tandem solar cell devices (e.g., tandem solar cell devices 210-1 through 210-3 of FIGS. 2-3). In some embodiments, the multiple device-level encapsulation layers are formed simultaneously during a deposition process (e.g. TFE process). In some embodiments, at least one device-level encapsulation layer is formed during a separate deposition process. Further details regarding the method of fabricating device 450 will be described below with reference to FIGS. 8A-8B and 10A-15.

Figure 5:
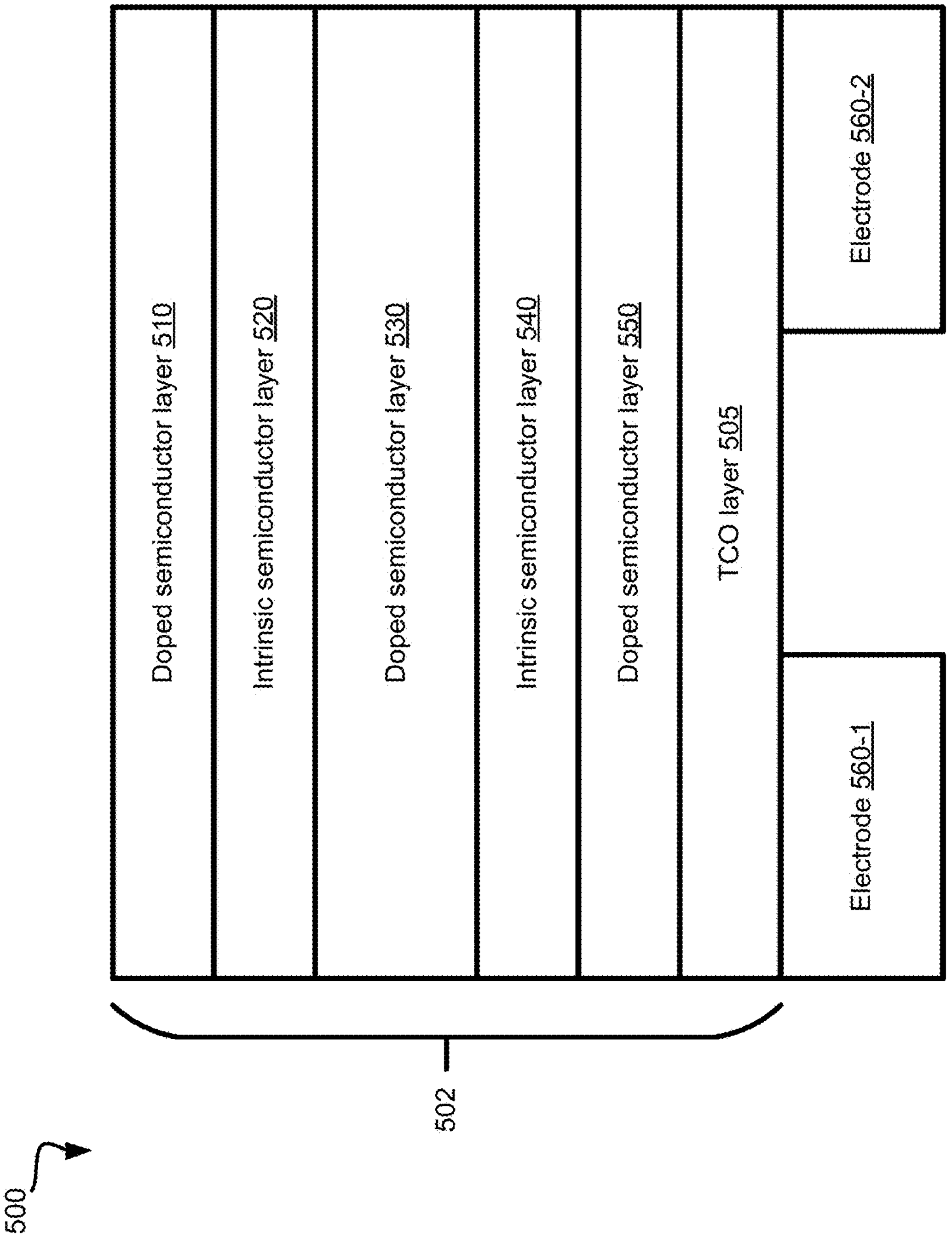
FIGS. 5-6 are block diagrams of example solar cells that can be included in a tandem solar cell device, in accordance with some embodiments.

FIG. 5 is a block diagram of an example solar cell 500 that can be included in a tandem solar cell device, in accordance with some embodiments. For example, solar cell 500 can correspond to solar cell 405-1 of FIG. 4A. As shown, solar cell 500 can include stack of alternating semiconductor layers ("stack") 502 disposed on TCO layer 505. In some embodiments, solar cell 500 is an HJT solar cell.

Each semiconductor layer of stack 502 is formed from a different type of semiconductor material. For example, as shown, stack 502 includes doped semiconductor layer 510 including a doped semiconductor material disposed on intrinsic semiconductor layer 520 including an intrinsic semiconductor material, intrinsic semiconductor layer 520 disposed on doped semiconductor layer 530 including a doped semiconductor material, doped semiconductor layer 530 disposed on intrinsic semiconductor layer 540 including an intrinsic semiconductor material, and intrinsic semiconductor layer 540 disposed on doped semiconductor layer 550 including a doped semiconductor material. As further shown, doped semiconductor layer 550 is disposed on TCO layer 502.

In some embodiments, the first semiconductor layer and the third semiconductor layer each include an n-type semiconductor material and the fifth layer includes a p-type semiconductor material. In some embodiments, the first semiconductor layer and the third semiconductor layer each include a p-type semiconductor material and the fifth layer includes an n-type semiconductor material. In some embodiments, each semiconductor layer 510-550 includes Si. For example, doped semiconductor layer 510 can be a doped a-Si layer, intrinsic semiconductor layer 520 can be an intrinsic i-Si layer, doped semiconductor layer 530 can be a doped c-Si layer (e.g., monocrystalline Si or polycrystalline Si), intrinsic semiconductor layer 540 can be an i-Si layer, and doped semiconductor layer 530 can be an a-Si layer. In some embodiments, doped semiconductor layer 510 and doped semiconductor layer 530 are each n-type layers (e.g., n-a-Si and n-c-Si) and doped semiconductor layer 550 is a p-type layer (i.e., p-a-Si). In some embodiments, doped semiconductor layer 510 and doped semiconductor layer 530 are each p-type layers (e.g., p-a-Si and p-c-Si) and doped semiconductor layer 550 is an n-type layer (e.g., n-a-Si).

TCO layer 505 can include any suitable TCO material. In some embodiments, TCO layer 505 includes IZO. In some embodiments, TCO layer 505 includes ITO. In some embodiments, TCO layer 505 includes ICO. In some embodiments, TCO layer 505 includes AZO. The composition of TCO layer 505 can be chosen depending on target properties (e.g., optical properties) of the TCO layer for a particular application. For example, if TCO layer 505 includes IZO, then TCO layer 505 can include a first amount of $In_2O_3$ and a second amount of ZnO. In some embodiments, TCO layer 505 is an IZO layer including about 90% $In_2O_3$ and about 10% ZnO. As another example, if TCO layer 505 includes ITO, then TCO layer 120 can include a first amount of $In_2O_3$ and a second amount of a tin oxide (e.g., $SnO_x$). In some embodiments, TCO layer 505 is an ITO layer including about 90% $In_2O_3$ and about 10% of the tin oxide.

As further shown, electrode 560-1 and electrode 560-2 can be disposed on TCO layer 505. Electrode 560-1 and electrode 560-2 can include any suitable material. For example, electrode 560-1 and electrode 560-2 can include Ag. Further details regarding solar cell 500 are described above with reference to FIG. 4A and further details regarding fabricating solar cell 500 will be described below with reference to FIGS. 9A-9D.

Figure 6:
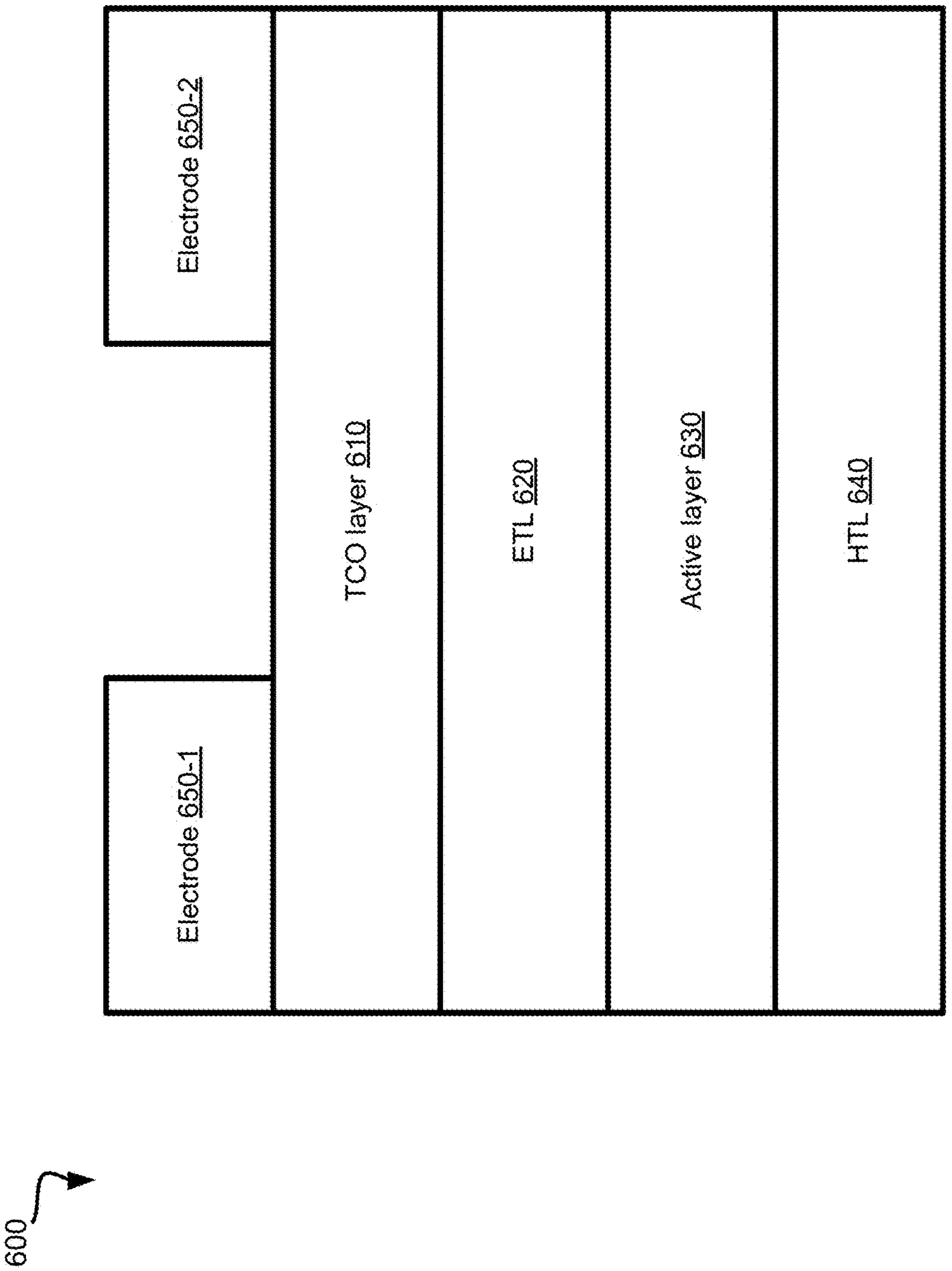

FIG. 6 is a block diagram of an example solar cell 600 that can be included in a tandem solar cell device, in accordance with some embodiments. For example, solar cell 600 can correspond to solar cell 405-2 of FIG. 4A. As shown, device 600 can TCO layer 610 disposed on ETL 620. In some embodiments, TCO layer 610 includes IZO. In some embodiments, TCO layer 610 includes ITO. In some embodiments, TCO layer 610 includes ICO. In some embodiments, TCO layer 610 includes AZO.

ETL 620 can include a material selected to enable electron transport. Examples of materials that can be used to form ETL 620 include $TiO_2$, ZnO, $SnO_2$, etc. In some embodiments, ETL 620 functions as a barrier layer to prevent the diffusion of impurities, which can improve stability and longevity of solar cell 600. ETL 620 can be formed using any suitable process. For example, ETL 620 can be formed using an evaporation process.

As further shown, ETL 620 can be disposed on active layer 630. In some embodiments, solar cell 600 is a perovskite solar cell and active layer 630 includes a perovskite layer including a perovskite material. The perovskite material can have a set of properties (e.g., bandgap) that enables absorption of solar radiation and generation of a larger number of electron-hole pairs, which can be separated and collected to generate an electrical current. One example of a perovskite material that can be used to form the perovskite layer is $CH_3NH_3PbI_3$. Active layer 630 can be formed using any suitable process. For example, a perovskite layer can be formed using an evaporation process, a CVD process, a printing process, etc.

In some embodiments, a buffer layer (not shown) is disposed between TCO layer 610 and ETL 620. The buffer layer can protect the stack of layers underneath TCO layer 610 (e.g., ETL 620 and active layer 630) during a process to form TCO layer 610 (e.g., a sputtering process).

As further shown, active layer 630 can be disposed on HTL 640 that can extract and transport holes (i.e., positive charges). HTL 640 can be formed from a material that has high hole mobility to enable transport of holes. For example, HTL 640 can be formed from a nickel oxide (e.g., $NiO_x$), a molybdenum oxide ($MoO_x$), a vanadium oxide ($VO_x$), a tungsten oxide ($WO_x$), a copper oxide ($CuO_x$ or $Cu_xO$), a copper gallium oxide ($CuGaO_x$), a copper aluminum oxide ($CuAlO_x$), a copper chromium oxide (e.g., $CuCrO_x$), ZnO, an aluminum nickel oxide ($Al_yNi_{1-y}O_x$), spiro-OMeTAD, PEDOT, etc. HTL 640 can be formed using any suitable process. For example, HTL 640 can be formed using an evaporation process.

As further shown, electrode 650-1 and electrode 650-2 can be disposed on TCO layer 610. Electrode 650-1 and electrode 650-2 can include any suitable material. For example, electrode 650-1 and electrode 650-2 can include Ag. Further details regarding solar cell 600 are described above with reference to FIG. 4A and further details regarding fabricating solar cell 600 will be described below with reference to FIGS. 9E-9I.

Figure 7:
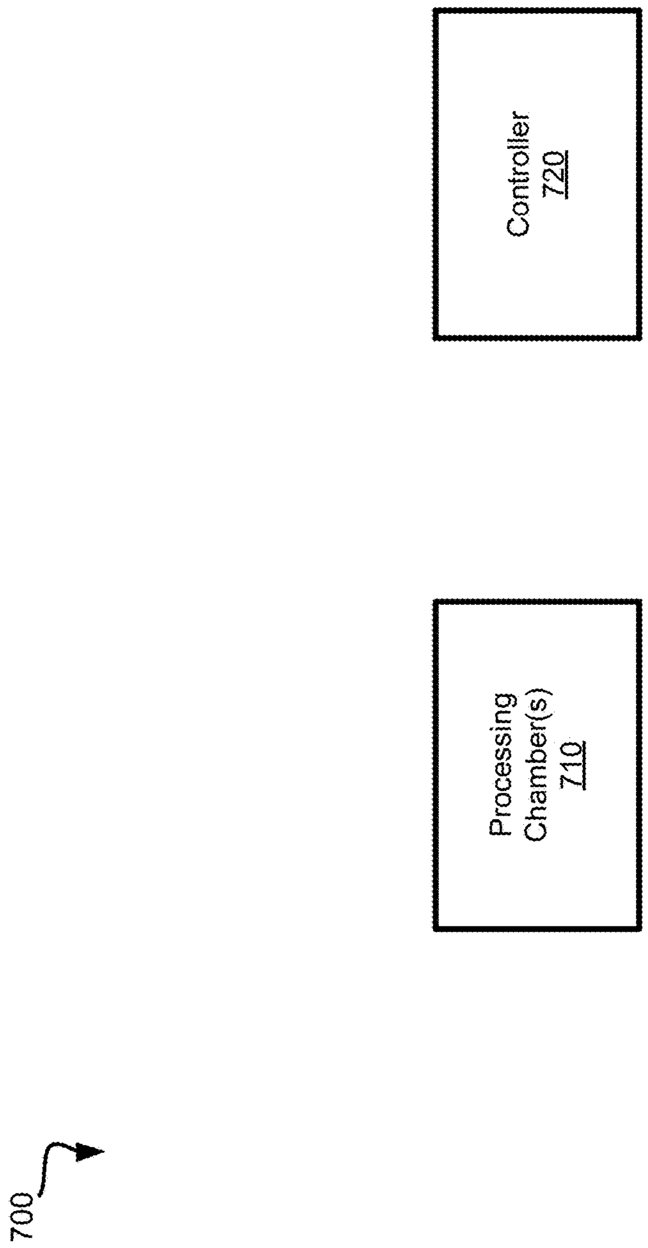
FIG. 7 is a diagram of a system for fabricating tandem solar cell devices using device-level encapsulation, in accordance with some embodiments.

FIG. 7 is a diagram of a system 700 for fabricating an electronic device using device-level encapsulation, in accordance with some embodiments. System 700 can include at least one processing chamber 710 communicably coupled to controller 720. In some embodiments, at least one processing chamber 710 includes a CVD chamber. System 700 can be used to perform device-level encapsulation of at least one tandem solar cell device. In some embodiments, a tandem solar device includes a first solar cell and a second solar cell. For example, the first solar cell can be a top solar cell and the second solar cell can be a bottom solar cell. For example, the first solar cell can include an ETL (e.g., a perovskite solar cell) and the second solar cell can be an HJT solar cell. Methods for fabricating electronic devices using the processing chamber will now be described below with reference to FIGS. 8A-8B.

Figure 8A:
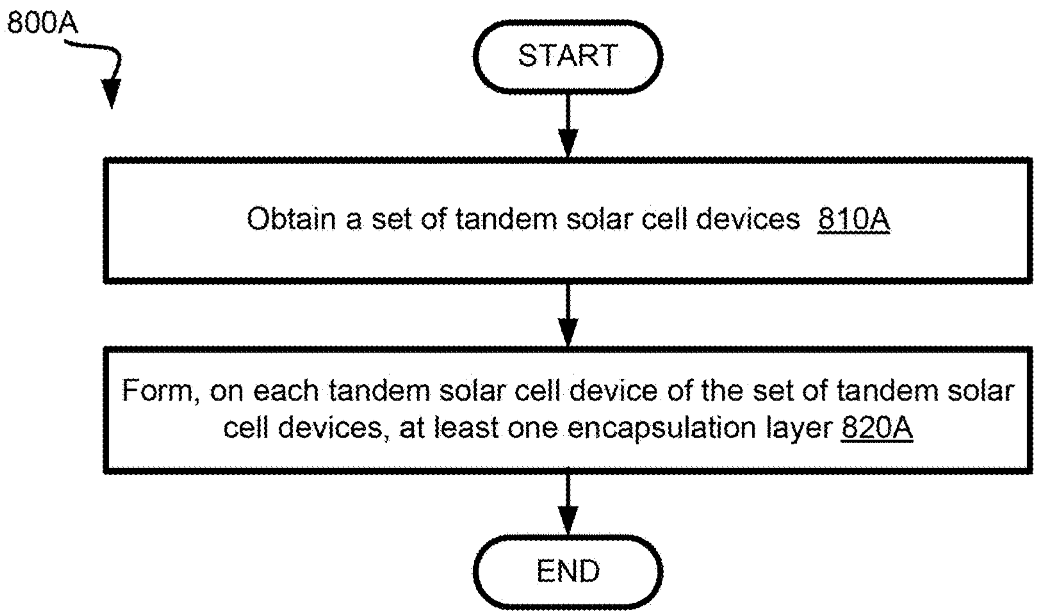
FIGS. 8A-8B are flowcharts of methods for fabricating tandem solar cell devices using device-level encapsulation, in accordance with some embodiments.

FIG. 8A is a flowchart of a method 800A for fabricating tandem solar cell devices using device-level encapsulation, in accordance with some embodiments. Method 800A can be performed by a system including a processing chamber communicable coupled to a controller that can include hardware (e.g., processing device, circuitry, dedicated logic, programmable logic, microcode, hardware of a device, integrated circuit, etc.), software (e.g., instructions run or executed on a processing device), or a combination thereof. In some implementations, method 800A is performed by one or more components of system 700 of FIG. 7. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various implementations. Thus, not all processes are required in every implementation. Other process flows are possible.

At operation 810A, at least one tandem solar cell device is obtained. In some embodiments, the at least one tandem solar cell device includes a plurality of solar cell devices. For example, the plurality of solar cell devices can correspond to a module. Each tandem solar cell device can include at least a first solar cell and a second solar cell. In some embodiments, a tandem solar cell device is a two-cell device. For example, the first solar cell can be a bottom solar cell and the second solar cell can be a top solar cell. In some embodiments, a recombination layer is disposed between the first solar cell and the second solar cell. For example, the recombination layer can be a TCO layer. In some embodiments, the first solar cell includes a stack of alternating semiconductor layers disposed on a TCO layer. For example, the solar cell can be an HJT solar cell. In some embodiments the second solar cell includes a stack of layers including an ETL disposed on an active layer, and a TCO layer disposed on the ETL. Additionally, the active layer can be disposed on an HTL. In some embodiments, the solar cell is a perovskite solar cell, then the active layer includes a perovskite layer. In some embodiments, a tandem solar cell device is a triple cell device.

In some embodiments, obtaining the substrate at operation 810A includes receiving the at least one tandem solar cell device within a processing chamber that can form the at least one encapsulation layer using TFE. For example, the at least one tandem solar cell device can be placed in a tray and loaded into the processing chamber. In some embodiments, the processing chamber is a CVD chamber, and the tray is a CVD tray. In some embodiments, a robot apparatus places the substrate in the processing chamber (e.g., the tray). The tray can have any suitable dimensions. In some embodiments, the tray has a width between about 300 mm to about 500 mm and a length between about 400 mm to about 600 mm.

At operation 820A, at least one encapsulation layer is formed on the at least one tandem solar cell device. Forming the at least one encapsulation layer on at least one tandem solar cell device at operation 820A can include forming each device-level encapsulation layer on a respective tandem solar cell device. A device-level encapsulation layer is a discrete encapsulation layer formed on a respective tandem solar cell device. More specifically, a device-level encapsulation layer is a discrete encapsulation layer formed along an upper surface and side surfaces of a respective tandem solar cell device. In some embodiments, forming a device-level encapsulation layer on a respective tandem solar cell device includes conformally depositing the device-level encapsulation layer along upper and side surfaces of the respective tandem solar cell device. For example forming a device-level encapsulation layer on a tandem solar cell device can include forming mask layers over respective portions of the tandem solar cell device (e.g., over electrodes) and the tray, and forming the device-level encapsulation layer on exposed portions of the top and side surfaces of the tandem solar cell device. In some embodiments, the mask layers correspond to a self-aligned mask. The mask layers can then be removed from the tandem solar cell device to obtain a device-level encapsulated device. The device-level encapsulation layer can include any suitable material in accordance with embodiments described herein. Examples of materials that can be used to form the device-level encapsulation layer include $Al_2O_3$, $SiN_x$, SION, SiCN, HMDSO, etc.

In some embodiments, a device-level encapsulation layer is formed on a tandem solar cell device using a TFE process. A TFE process can be a low temperature process to protect components of the tandem solar cell device (e.g., the active layer (e.g., perovskite layer) of the second solar cell). In some embodiments, the TFE process is performed at a temperature of less than or equal to about 150° C. In some embodiments, the TFE process is performed at a temperature of less than or equal to about 100° C.

In some embodiments, the at least one tandem solar cell device includes a plurality of tandem solar cell devices. After the device-level encapsulation, the plurality of tandem solar cell devices can be formed within a module. In some embodiments, forming the at least one encapsulation layer on the at least one tandem solar cell device further includes performing module-level encapsulation by forming at least one module-level encapsulation layer on the module. The module-level encapsulation layer can be formed in the same processing chamber as the device-level encapsulation layer, or a different processing chamber than the device-level encapsulation layer. In some embodiments, forming the at least one module-level encapsulation layer includes forming an encapsulant over the plurality of tandem solar cell devices. In some embodiments, the encapsulant can include a polymer material. For example, the polymer material can include EVA, PIB, butyl rubber, an epoxy resin, etc. In some embodiments, forming the at least one module-level encapsulation layer further includes forming a pair of glass layers over the encapsulant, where the encapsulant and plurality of tandem solar cell devices are disposed between the pair of glass layers. In some embodiments, the pair of glass layers include tempered glass. Further details regarding operations 810A-820A are described above with reference to FIGS. 1-7 and will now be described below with reference to FIG. 8B.

Figure 8B:
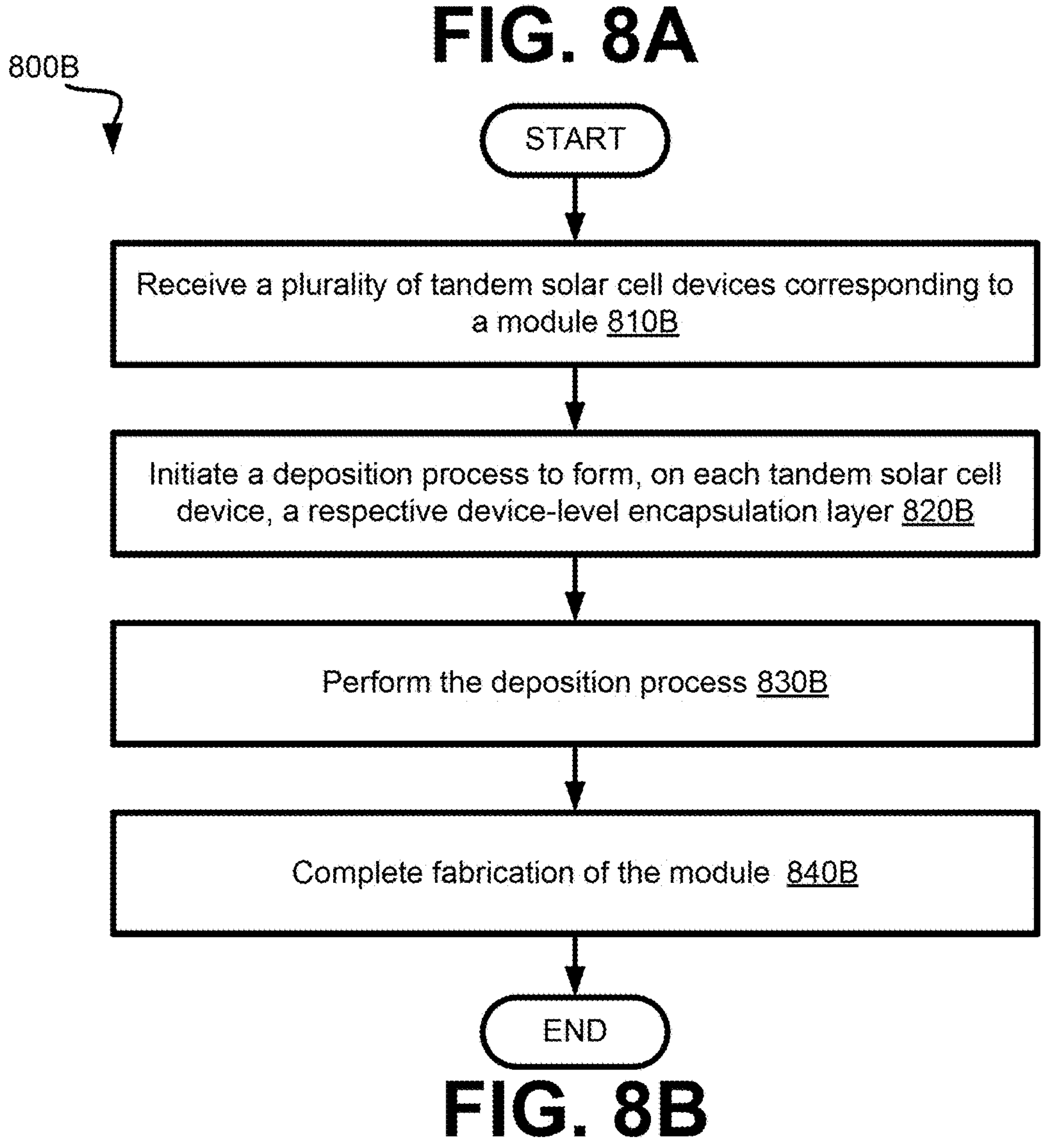

FIG. 8B is a flowchart of a method 800B for fabricating tandem solar cell devices using device-level encapsulation, in accordance with some embodiments. Method 800B can be performed by a system including a processing chamber communicable coupled to a controller that can include hardware (e.g., processing device, circuitry, dedicated logic, programmable logic, microcode, hardware of a device, integrated circuit, etc.), software (e.g., instructions run or executed on a processing device), or a combination thereof. In some implementations, method 800B is performed by one or more components of system 700 of FIG. 7. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various implementations. Thus, not all processes are required in every implementation. Other process flows are possible.

At operation 810B, a plurality of tandem solar cell devices corresponding to a module is received. For example, the plurality of tandem solar cell devices can be placed within a tray and placed within a processing chamber. In some embodiments, a robot apparatus places the plurality of tandem solar cells in the processing chamber. In some embodiments, the processing chamber is a CVD chamber and the tray is a CVD tray. Further details regarding the plurality of tandem solar cell devices are described above with reference to FIGS. 1-6 and 8A.

At operation 820B, a deposition process to form, on each tandem solar cell device, a respective device-level encapsulation layer is initiated and, at operation 830B, the deposition process is performed. For example, a controller communicably coupled to the processing chamber can initiate the deposition process. In some embodiments, the deposition process is a TFE process. For example, the TFE process can be similar to the TFE process described above with reference to FIG. 8A. At operation 840B, fabrication of the module is completed. For example, completing fabrication of the module include forming electrical connections to connect each tandem solar cell to a pair of terminals. As another example, completing fabrication of the module can include performing module-level encapsulation, similar to that described above with reference to FIG. 8A. Further details regarding operations 810B-840B are described above with reference to FIGS. 1-8A.

Figure 9A:
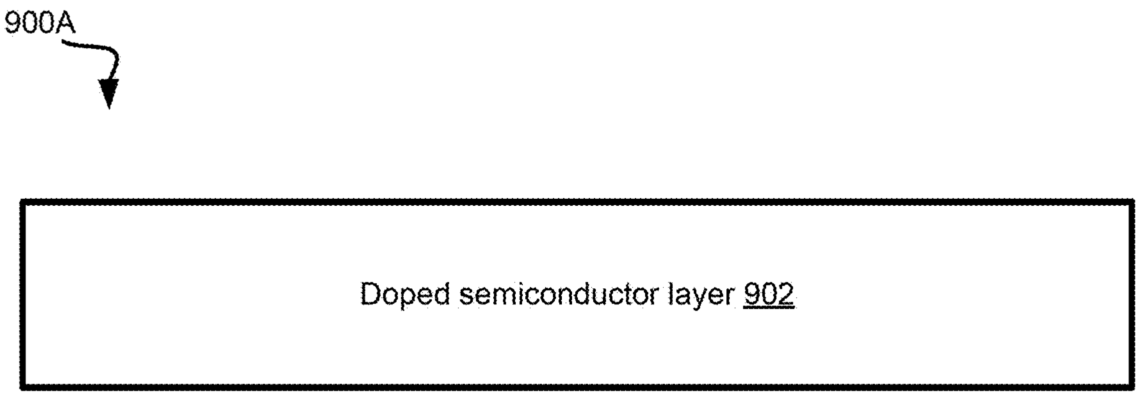
FIGS. 9A-9I are block diagrams illustrating cross-sectional views during the fabrication a tandem solar cell device, in accordance with some embodiments.
Figure 9B:
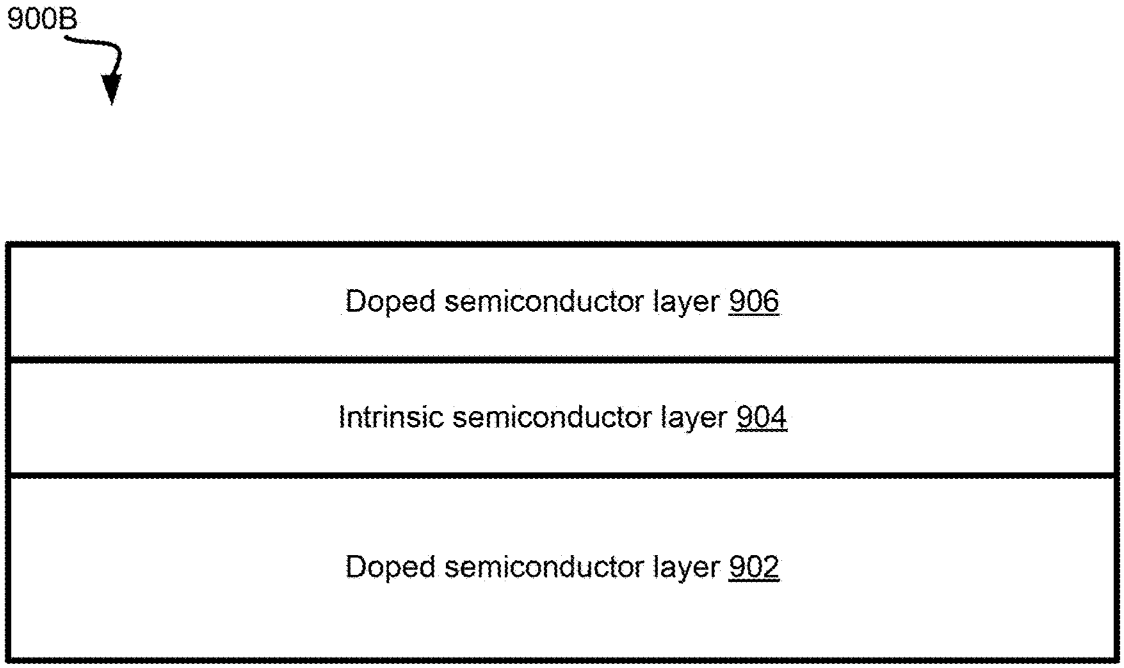
Figure 9C:
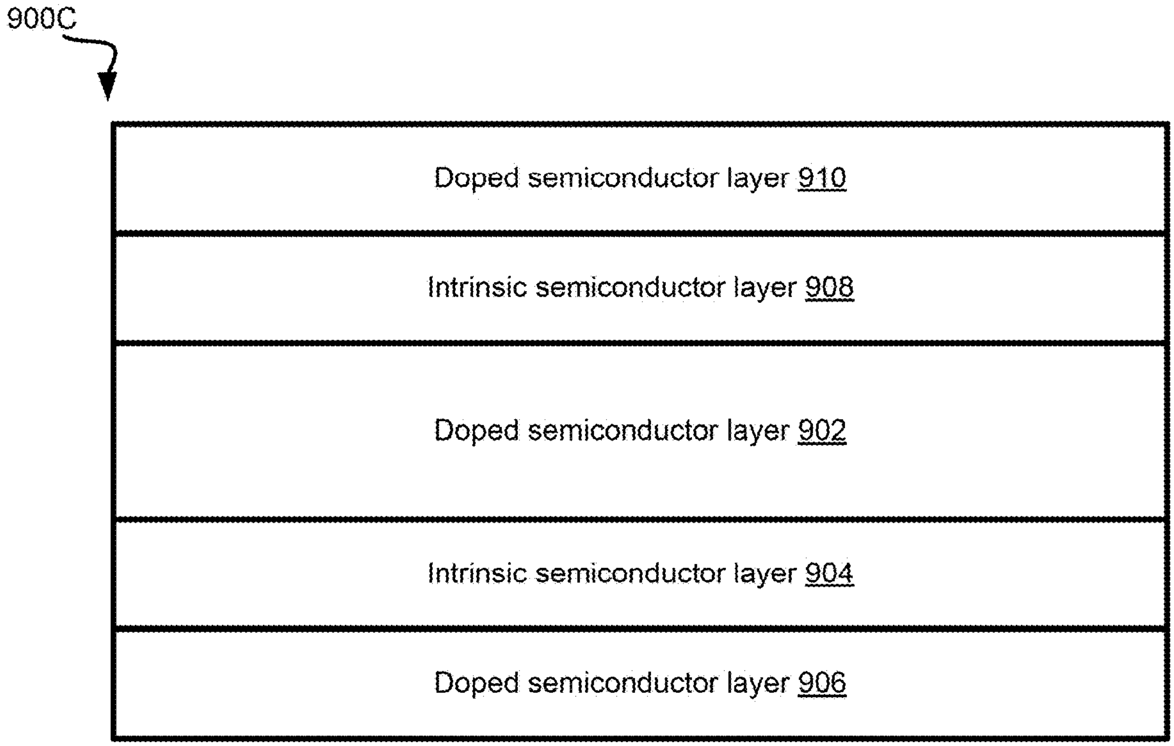
Figure 9D:
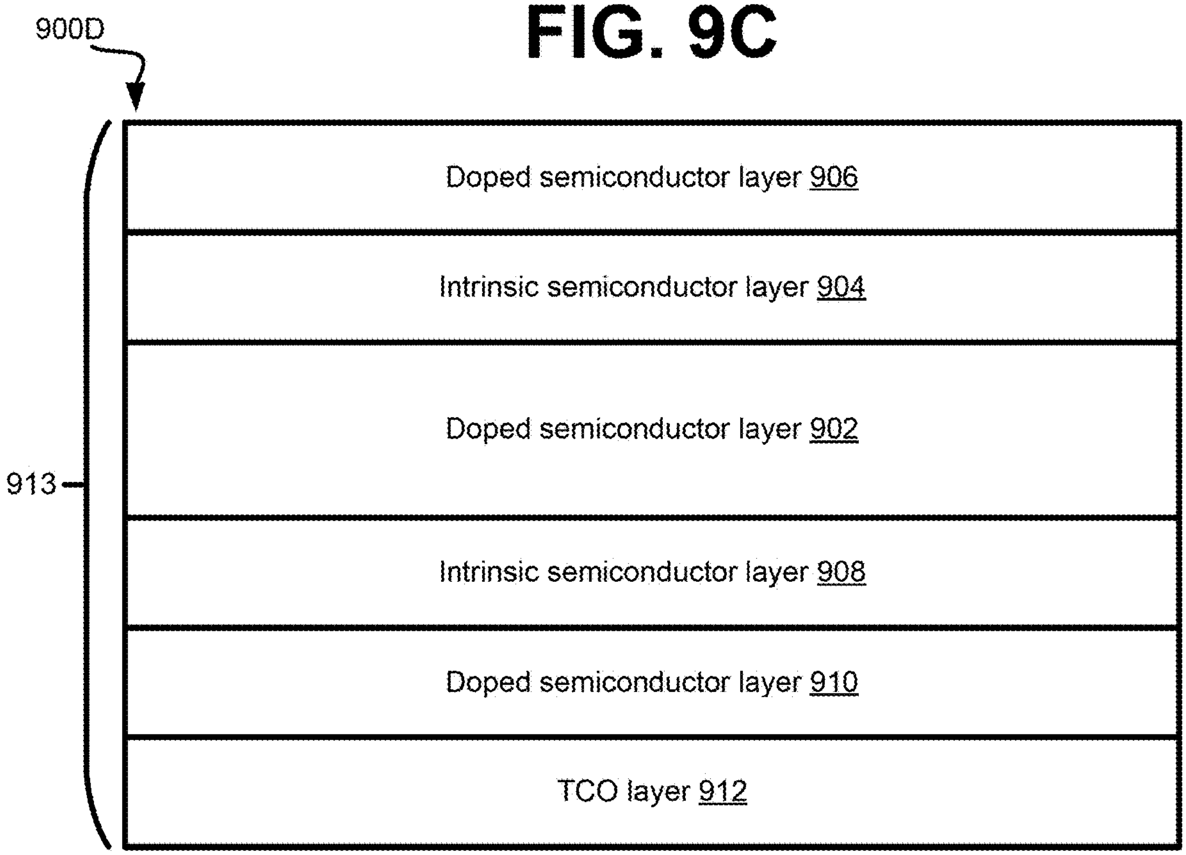
Figure 9E:
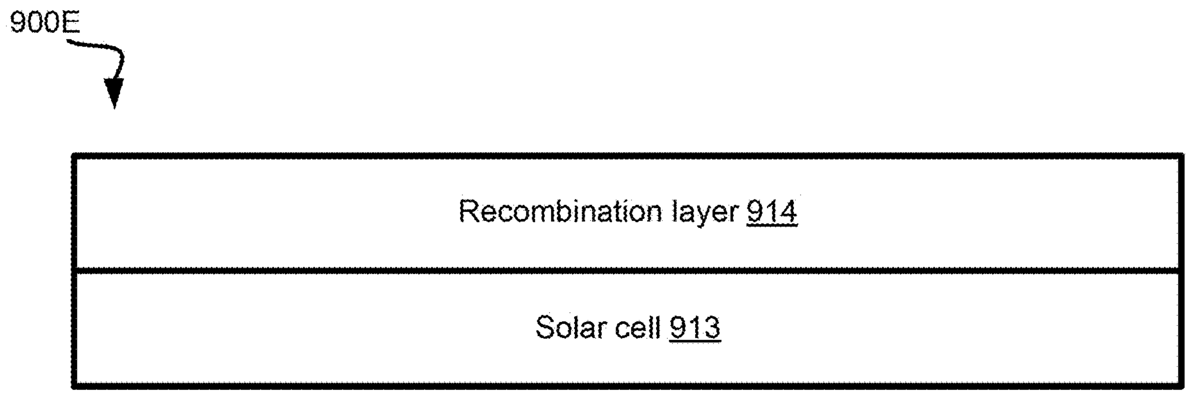
Figure 9F:
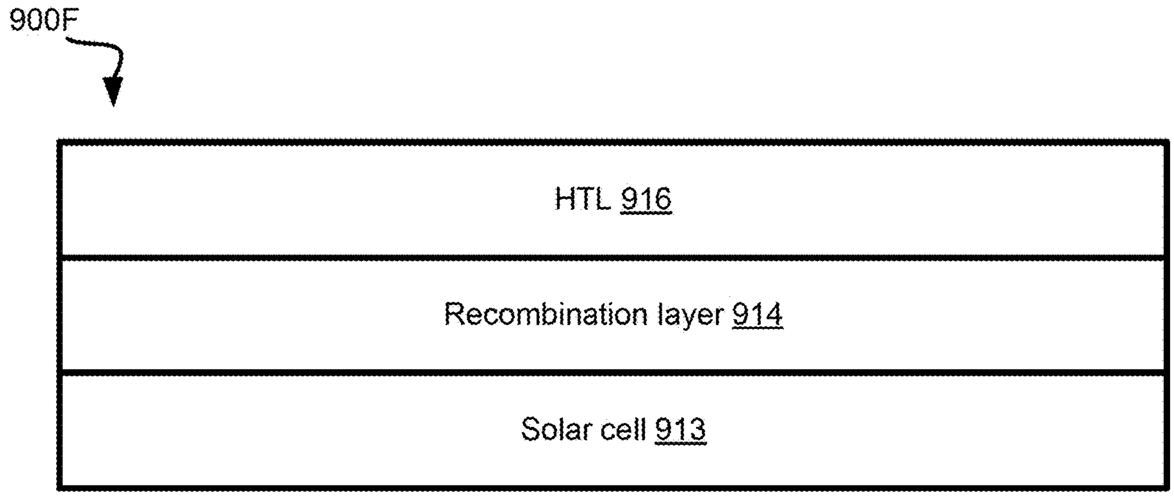

FIGS. 9A-9I are block diagrams illustrating cross-sectional views of the fabrication of a tandem solar cell device, in accordance with some embodiments. More specifically, FIGS. 9A-9E illustrate the formation of a first solar cell (e.g., bottom solar cell) of the tandem solar cell device, FIG. 9F illustrates the formation of a recombination layer on the first solar cell, and FIGS. 9G-9J illustrate the formation of a second solar cell (e.g., top solar cell of the tandem solar cell device. In these illustrative examples, the first solar cell includes a stack of alternating semiconductor layers (e.g., an HJT solar cell) and the second solar cell includes a stack of layers including an ETL (e.g., a perovskite solar cell).

FIG. 9A is a diagram 900A showing doped semiconductor layer 902. Doped semiconductor layer 902 can be a substrate of the tandem solar cell device (e.g., wafer). For example, doped semiconductor layer 902 can be similar to doped semiconductor layer 530 described above with reference to FIG. 5. Doped semiconductor layer 902 can be processed by performing wafer texturing and/or cleaning. Further details regarding doped semiconductor layer 902 are described above with reference to FIG. 5.

FIG. 9B is a diagram 900B showing the formation of intrinsic semiconductor layer 904 on doped semiconductor layer 902, and doped semiconductor layer 906 on intrinsic semiconductor layer 904, resulting in a first intermediate structure. For example, intrinsic semiconductor layer 904 can be similar to intrinsic semiconductor layer 520 described above with reference to FIG. 5, and doped semiconductor layer 906 can be similar to doped semiconductor layer 510 described above with reference to FIG. 5. Layers 904 and 906 can be formed using any suitable processes. For example, layers 904 and 906 can be formed using a CVD process. Further details regarding layers 904 and 906 are described above with reference to FIG. 5.

FIG. 9C is a diagram 900C showing, after flipping the first intermediate structure, the formation of intrinsic semiconductor layer 908 on doped semiconductor layer 902, and doped semiconductor layer 910 on intrinsic semiconductor layer 908, resulting in a second intermediate structure. For example, intrinsic semiconductor layer 908 can be similar to intrinsic semiconductor layer 540 described above with reference to FIG. 5, and doped semiconductor layer 910 can be similar to doped semiconductor layer 550 described above with reference to FIG. 5. Layers 908 and 910 can be formed using any suitable processes. For example, layers 908 and 910 can be formed using a CVD process. Further details regarding layers 908 and 910 are described above with reference to FIG. 5.

FIG. 9D is a diagram 900D showing, after flipping the second intermediate structure, the formation of TCO layer 912 underneath doped semiconductor layer 910, resulting in solar cell 913. TCO layer 912 can be similar to TCO layer 502 described above with reference to FIG. 5. More specifically, TCO layer 912 can be formed using a back-side deposition process. In some embodiments, TCO layer 912 is formed using a physical vapor deposition (PVD) process. In some embodiments, solar cell 913 is an HJT solar cell. Further details regarding TCO layer 912 are described above with reference to FIG. 5.

FIG. 9E is a diagram 900E showing the formation of recombination layer 914 on solar cell 913. For example, recombination layer 914 can include a TCO layer. Recombination layer 914 can be similar to recombination layer 404 described above with reference to FIG. 4. More specifically, recombination layer 914 can be formed using a front-side deposition process. In some embodiments, recombination layer 914 is formed using a PVD process. Further details regarding recombination layer 914 are described above with reference to FIG. 4.

FIG. 9F is a diagram 900F showing the formation of HTL 916 on recombination layer 914. HTL 916 can be similar to HTL 610 described above with reference to FIG. 6. HTL 916 can be formed using any suitable process. In some embodiments, HTL 916 is formed using an evaporation process. Further details regarding HTL 916 are described above with reference to FIG. 6.

Figure 9G:
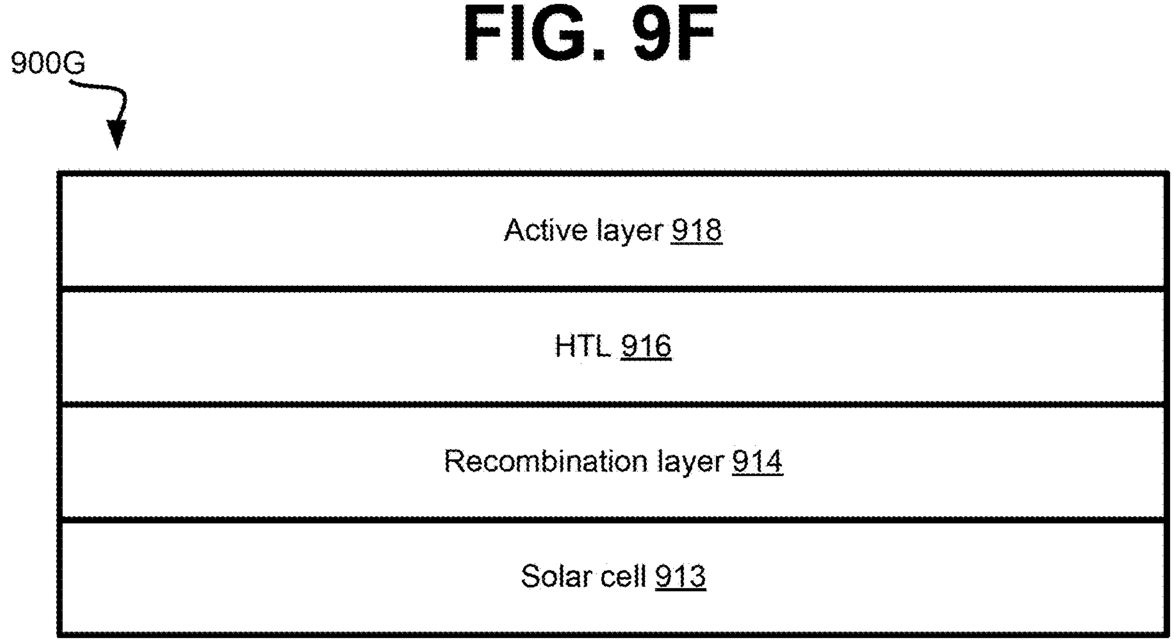

FIG. 9G is a diagram 900G showing the formation of active layer 918 on HTL 916 on recombination layer 914. Active layer 918 can be similar to active layer 620 described above with reference to FIG. 6. In some embodiments, active layer 918 includes a perovskite layer. In some embodiments, active layer 918 includes a buffer layer disposed on the perovskite layer. Active layer 918 can be formed using any suitable process. In some embodiments, forming active layer 918 includes forming the perovskite layer using an evaporation process. In some embodiments, forming active layer 918 includes forming the perovskite layer using a CVD process. In some embodiments, forming active layer 918 includes forming the perovskite layer using a printing process. forming active layer 918 includes forming the buffer layer using an ALD process. Further details regarding active layer 918 are described above with reference to FIG. 2.

Figure 9H:
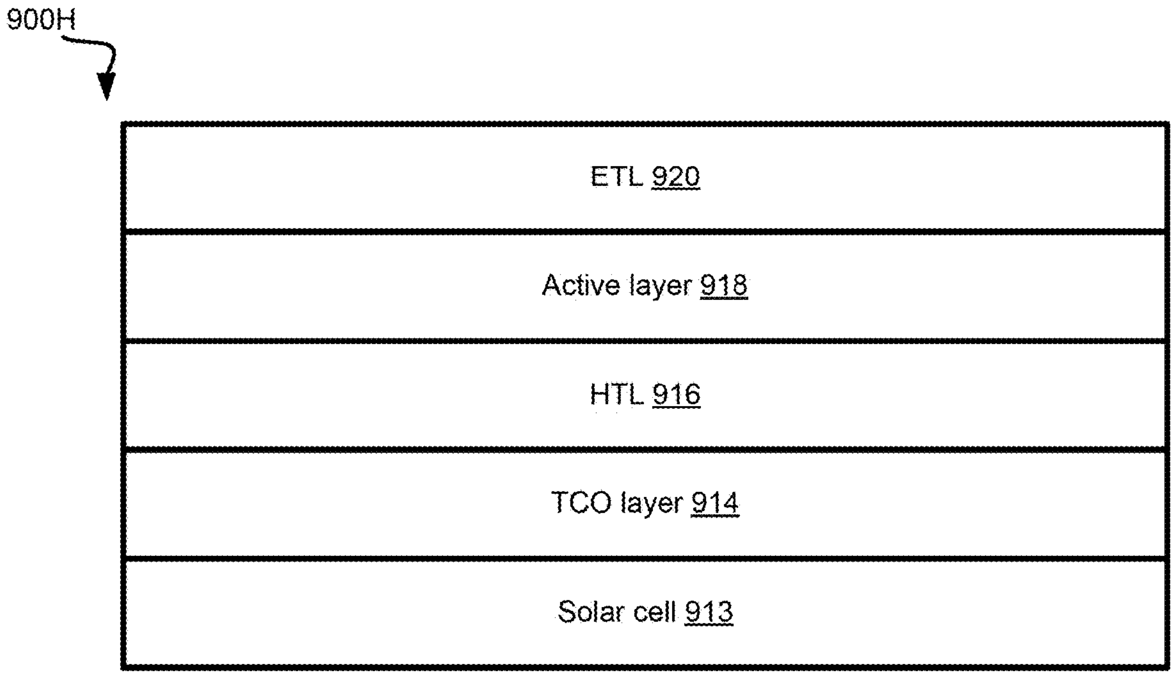
Figure 9I:
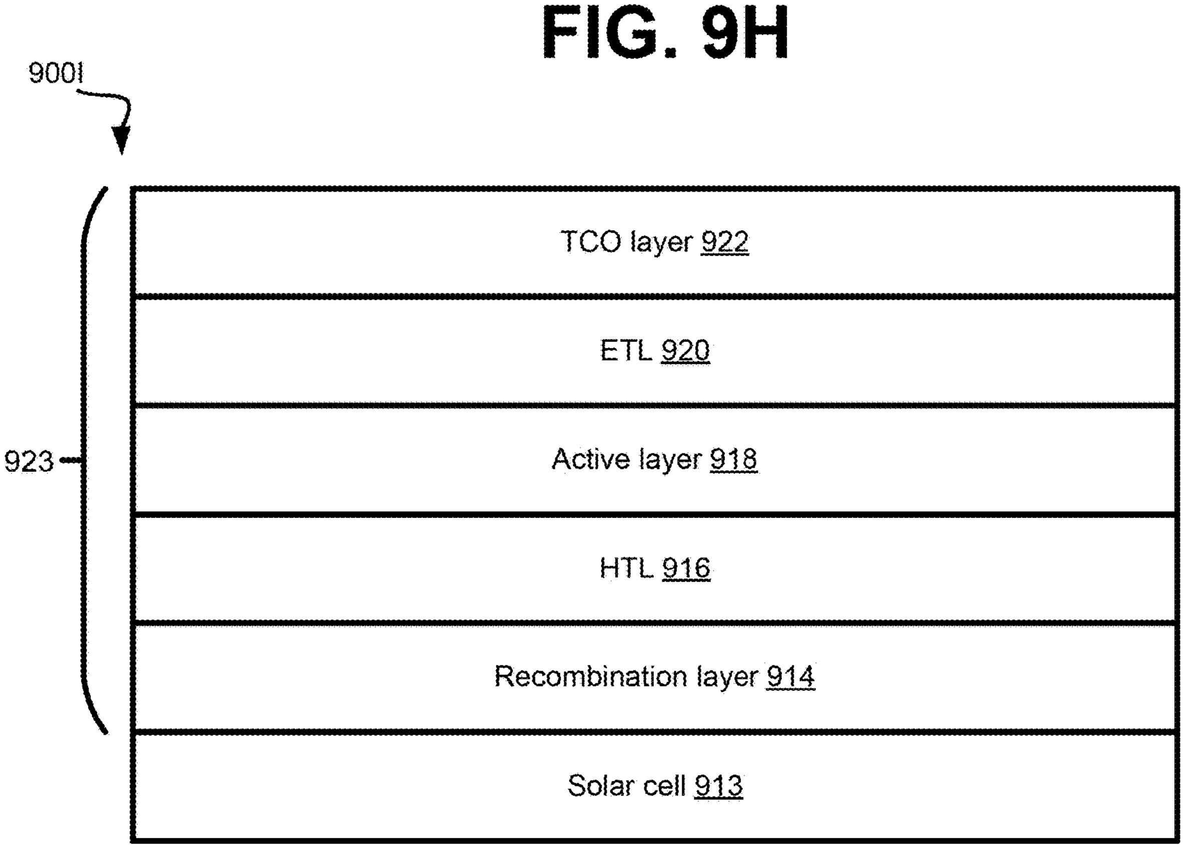

FIG. 9H is a diagram 900H showing the formation of ETL 920 on active layer 918. ETL 920 can be similar to ETL 210 described above with reference to FIG. 2. ETL 920 can be formed using any suitable process. In some embodiments, ETL 920 is formed using an evaporation process. Further details regarding ETL 920 are described above with reference to FIG. 2.

FIG. 91 is a diagram 900I showing the formation of TCO layer 922 on ETL 920, resulting in solar cell 923. TCO layer 922 can be similar to TCO layer 640 described above with reference to FIG. 6. TCO layer 922 can be formed using any suitable process. In some embodiments, TCO layer 922 is formed using a PVD process. In some embodiments, solar cell 923 is a perovskite solar cell. Further details regarding TCO layer 922 are described above with reference to FIG. 2. A first set of electrodes can be formed on solar cell 913 and a second set of electrodes can be formed on solar cell 923 (e.g., electrodes 410-1 through 410-4 as shown in FIG. 4). The first and second sets of electrodes can be formed using any suitable process. In some embodiments, the first and second sets of electrodes are formed using a printing process. Further details regarding the first and second sets of electrodes are described above with reference to FIG. 4.

Figure 10A:
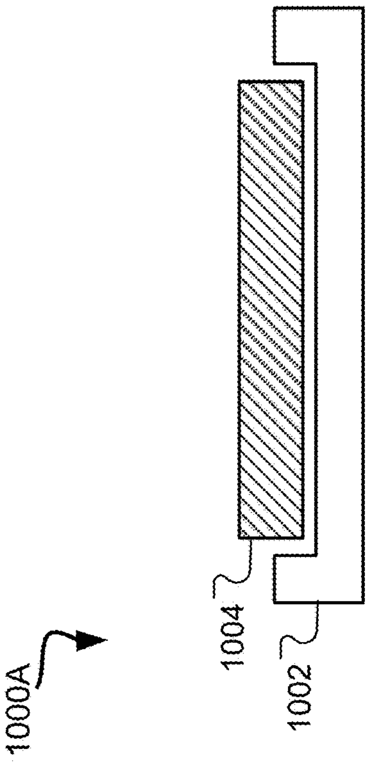
FIGS. 10A-15 are diagrams illustrating the fabrication of a tandem solar cell device using device-level encapsulation, in accordance with some embodiments.
Figure 10B:
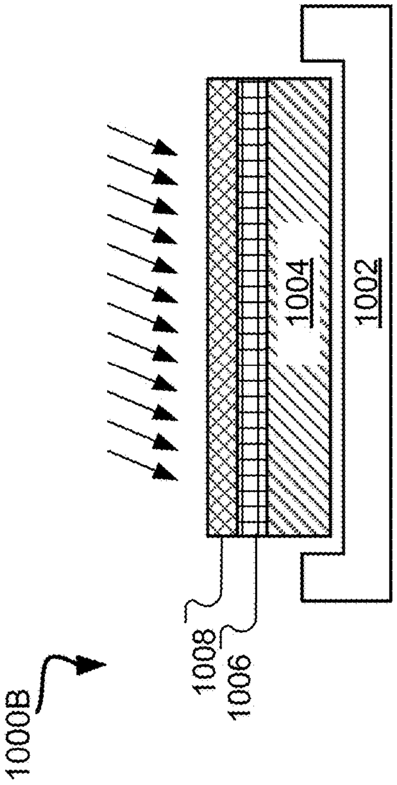
Figure 10C:
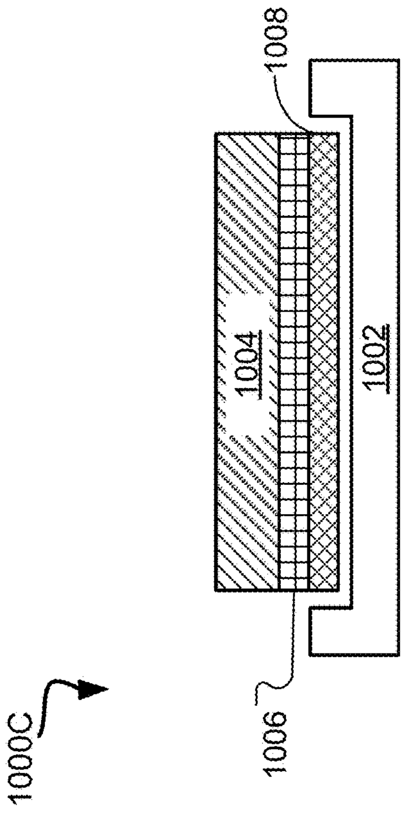
Figure 10D:
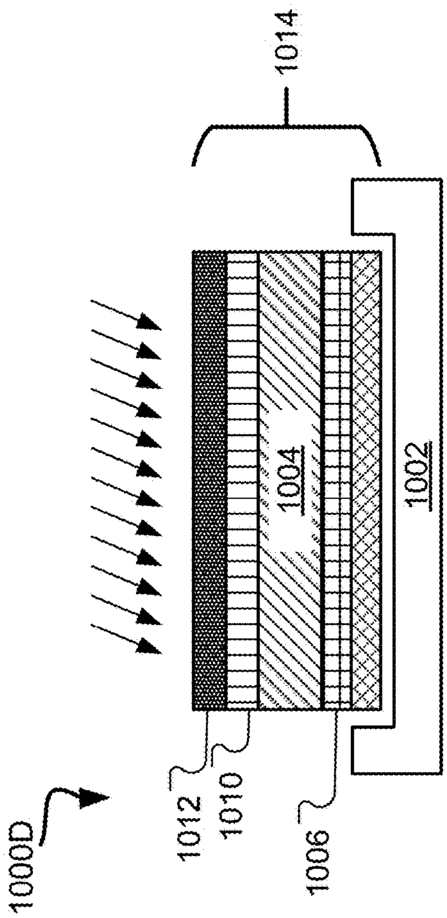

FIGS. 10A-10C are diagrams illustrating the fabrication of a tandem solar cell device using device-level encapsulation during a first phase, in accordance with some embodiments. Referring to FIG. 10A, diagram 1000A illustrates tray 1002 and doped semiconductor layer 1004 placed on tray 1002 for processing with a processing chamber. For example, doped semiconductor layer 1004 can correspond to doped semiconductor layer 530 of FIG. 5. In some embodiments, the processing chamber is a CVD chamber. Referring to FIG. 10B, diagram 1000B illustrates intrinsic semiconductor layer 1006 deposited on doped semiconductor layer 1004, and doped semiconductor layer 1008 deposited on intrinsic semiconductor layer 1006 (e.g., within the processing chamber). For example, intrinsic semiconductor layer 1006 can correspond to intrinsic semiconductor layer 540 of FIG. 5, and doped semiconductor layer 1108 can correspond to doped semiconductor layer 550 of FIG. 5. In some embodiments, both layers 1006 and 1008 are each deposited by CVD. Layers 1006 and 1008 may be deposited "depo-down," meaning that the deposition of material is directed downward onto doped semiconductor layer 1004. Referring to FIG. 10C, diagram 1000C shows layers 1004-1008 being flipped on tray 1002. In some embodiments, layers 1004-1008 are flipped by a substrate flipper that may include a substrate transfer robot. Referring to FIG. 10D, intrinsic semiconductor layer 1010 is deposited on doped semiconductor layer 1004, and doped semiconductor layer 1012 is deposited on intrinsic semiconductor layer 1010 (e.g., within the processing chamber), resulting in intermediate structure 1014. For example, intrinsic semiconductor layer 1010 can correspond to intrinsic semiconductor layer 520 of FIG. 5, and doped semiconductor layer 1012 can correspond to doped semiconductor layer 510 of FIG. 5. In some embodiments, layers 1010 and 1012 are each deposited by CVD. For example, layers 1010 and 1012 may be deposited depo-down.

Figure 11B:
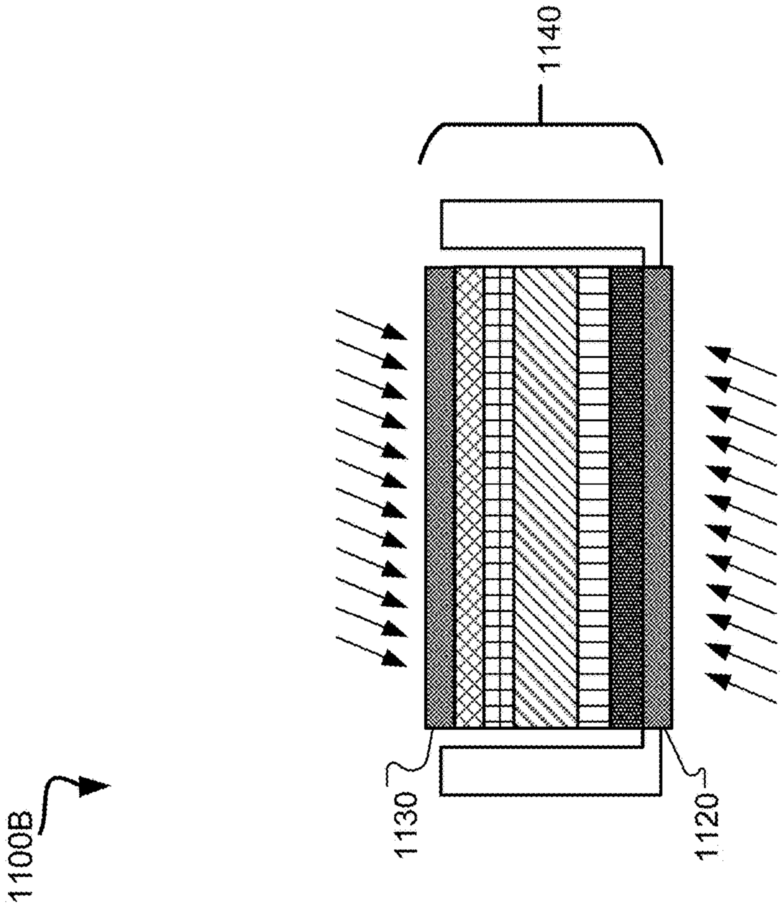
Figure 11A:
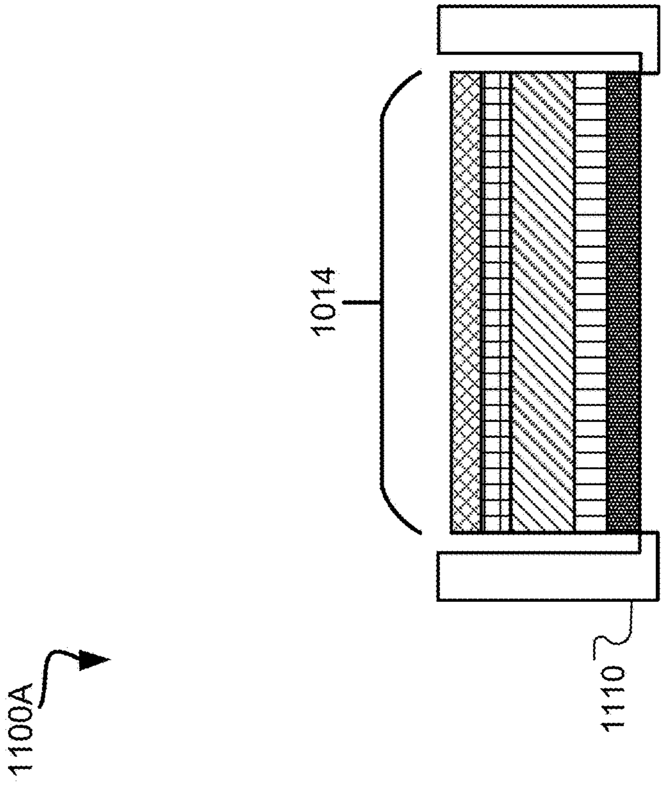

FIGS. 11A-11B are diagrams illustrating the fabrication of a tandem solar cell device using device-level encapsulation during a second phase, in accordance with some embodiments. Referring to FIG. 11A, intermediate structure 1014 is placed in tray 1110 for processing with a processing chamber. In some embodiments, the processing chamber is a PVD chamber. In some embodiments, tray 1110 includes a window to expose the bottom of the processed substrate for further material deposition. Referring to FIG. 11B, TCO layers 1120 and 1130 are deposited on intermediate structure 1140 within the processing chamber (e.g., by one or more PVD processes), resulting in intermediate structure 1140. For example, TCO layer 1120 can correspond to TCO layer 505 of FIG. 5, and TCO layer 1130 can be a recombination layer (e.g., recombination layer 404 of FIG. 4A). Layers 1120 and 1130 may be separately deposited (e.g., during separate deposition operations) or deposited during one operation. In some embodiments, TCO layer 1120 is deposited "depo-up," meaning the deposition material directed upward onto intermediate structure 1014, and TCO layer 1130 is deposited depo-down. For example, intermediate structure 1140 can include a recombination layer disposed on an HJT solar cell.

Figures 12A, 12B, 12C, 12D:
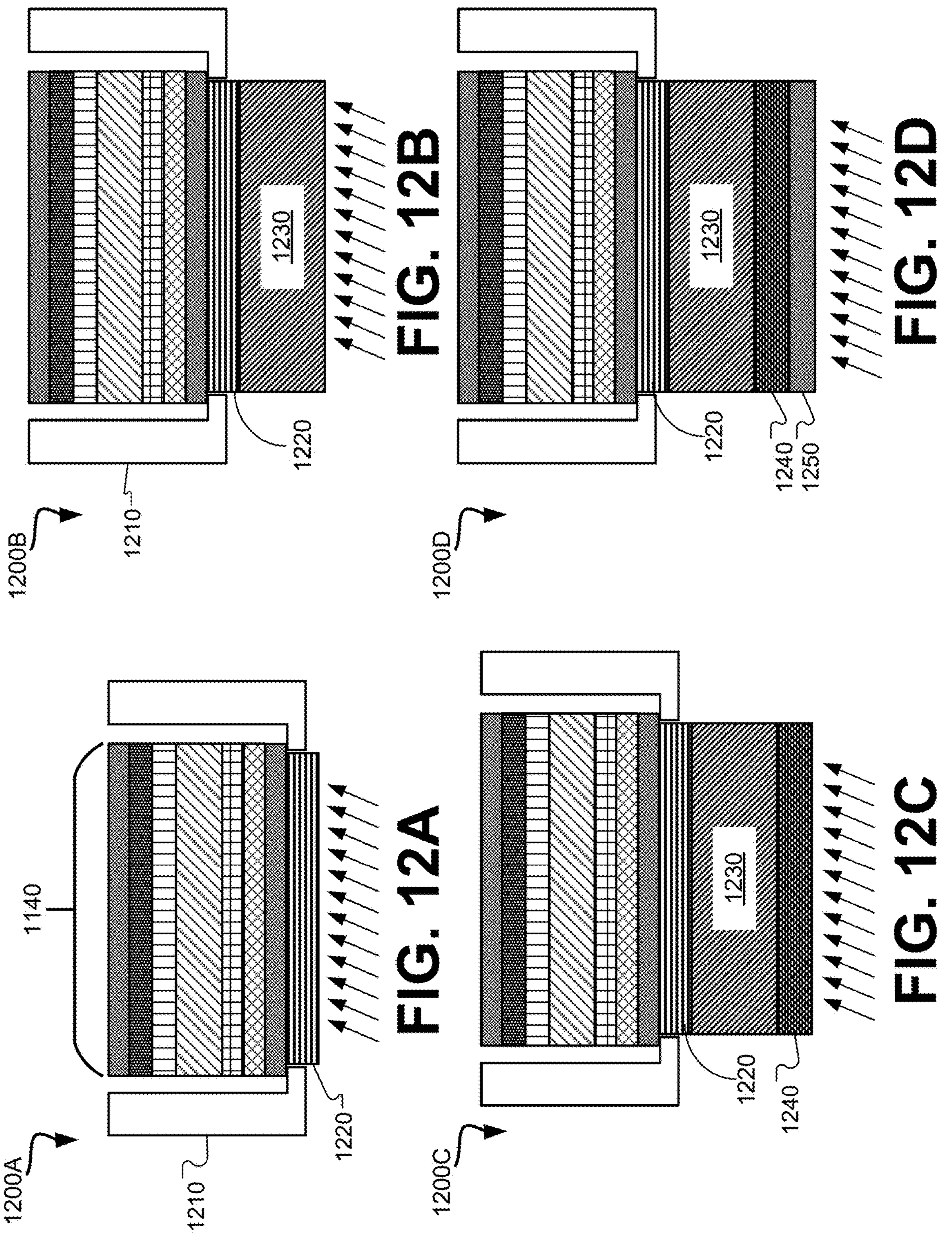
Figure 12E:
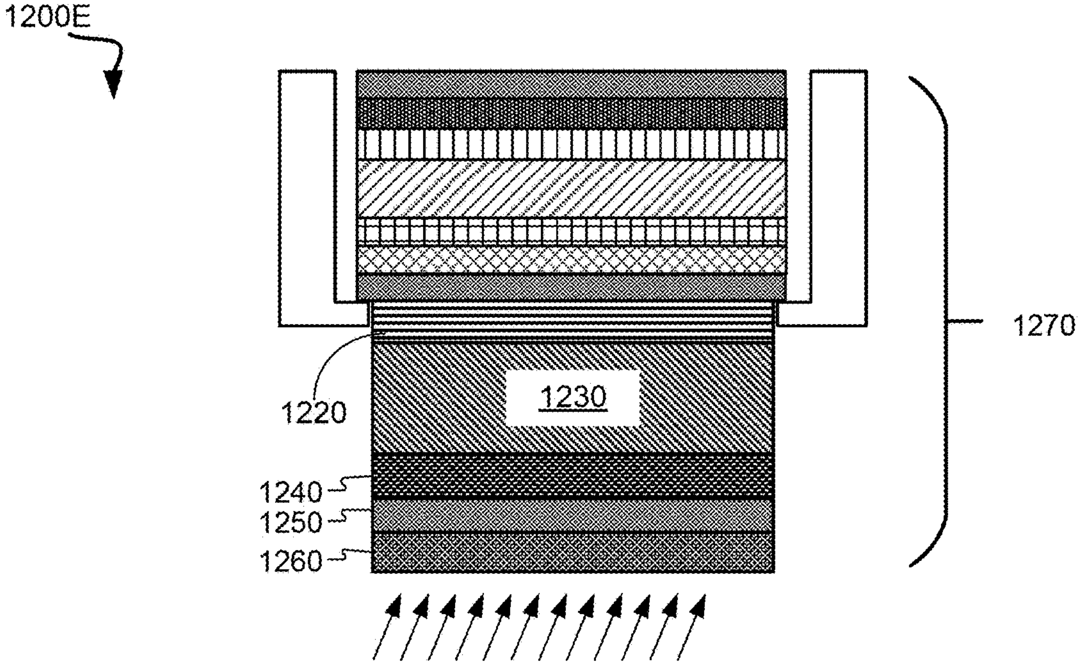

FIGS. 12A-12E are diagrams illustrating the fabrication of a tandem solar cell device using device-level encapsulation during a third phase, in accordance with some embodiments. Referring to FIG. 12A, intermediate structure 1140 is placed in a tray 1210 for processing within a processing chamber. In some embodiments, tray 1210 is a gridded tray having a window to expose the surface of intermediate structure 1140 for further material deposition. In some embodiments, tray 1210 includes an electrostatic chuck to electrostatically hold intermediate structure 1140. Although tray 1210 is shown holding intermediate structure in a horizontal orientation, tray 1210 may be configured to hold intermediate structure 1140 in a vertical orientation (e.g., holding intermediate structure 1140 at an angle 90° to as shown). In some embodiments, HTL 1220 is deposited on intermediate structure 1140 (e.g., by evaporation). For example, HTL 1220 can correspond to HTL 640 of FIG. 6. HTL 1220 may be deposited depo-up. Referring to FIG. 12B, active layer 1230 is deposited on HTL 1220 (e.g., by evaporation). For example, active layer 1230 can correspond to active layer 630 of FIG. 6. Active layer 1230 may be deposited depo-up. Referring to FIG. 12C, ETL 1240 is deposited on active 1120 (e.g., by evaporation). For example, ETL 1240 can correspond to ETL 620 of FIG. 6. ETL 1140 may be deposited depo-up. Referring to FIG. 12D, buffer layer 1250 may be deposited on ETL 220 (e.g., by evaporation). Buffer layer 1250 may be deposited depo-up. Referring to FIG. 12E, TCO layer 1260 is deposited on buffer layer 1250 (e.g., by PVD), resulting in intermediate structure 1270. For example, TCO layer 1260 can correspond to TCO layer 610 of FIG. 6. TCO layer 1260 may be deposited depo-up. In some embodiments, intermediate structure 1270 includes a recombination layer disposed between a perovskite solar cell and an HJT solar cell.

Figure 13A:
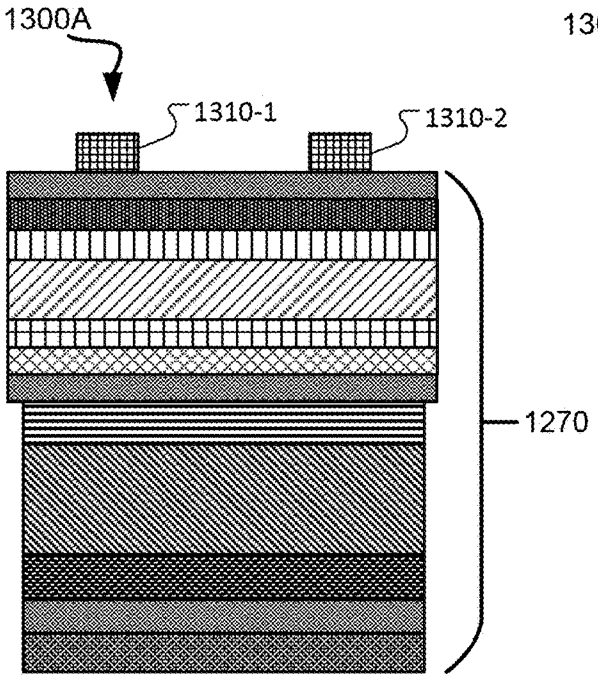
Figure 13B:
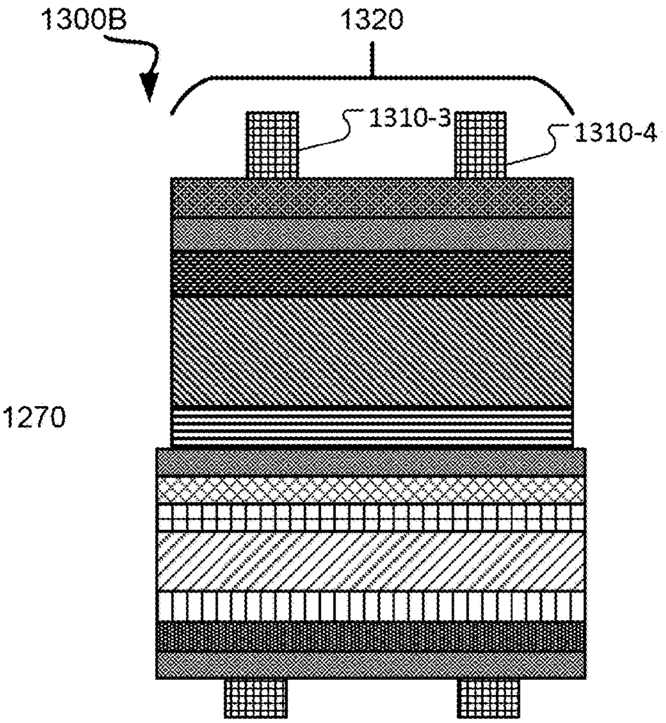

FIGS. 13A-13B are diagrams illustrating the fabrication of a tandem solar cell device using device-level encapsulation during a fourth phase, in accordance with some embodiments. Referring to FIG. 13A, electrodes 1310-1 and 1310-2 are printed on intermediate structure 1270 (e.g., by a printing element). Referring to FIG. 13B, in some embodiments, intermediate structure 1270 is flipped (e.g., by a substrate flipper), and electrodes 1310-3 and 1310-4 are printed on intermediate structure 1270, resulting in tandem solar cell device 1320. For example, electrodes 1310-1 and 1310-2 can correspond to electrodes 410-1 and 410-2 of FIG. 4D, and electrodes 1310-3 and 1310-4 can correspond to electrodes 410-3 and 410-4 of FIG. 4D.

Figure 14B:
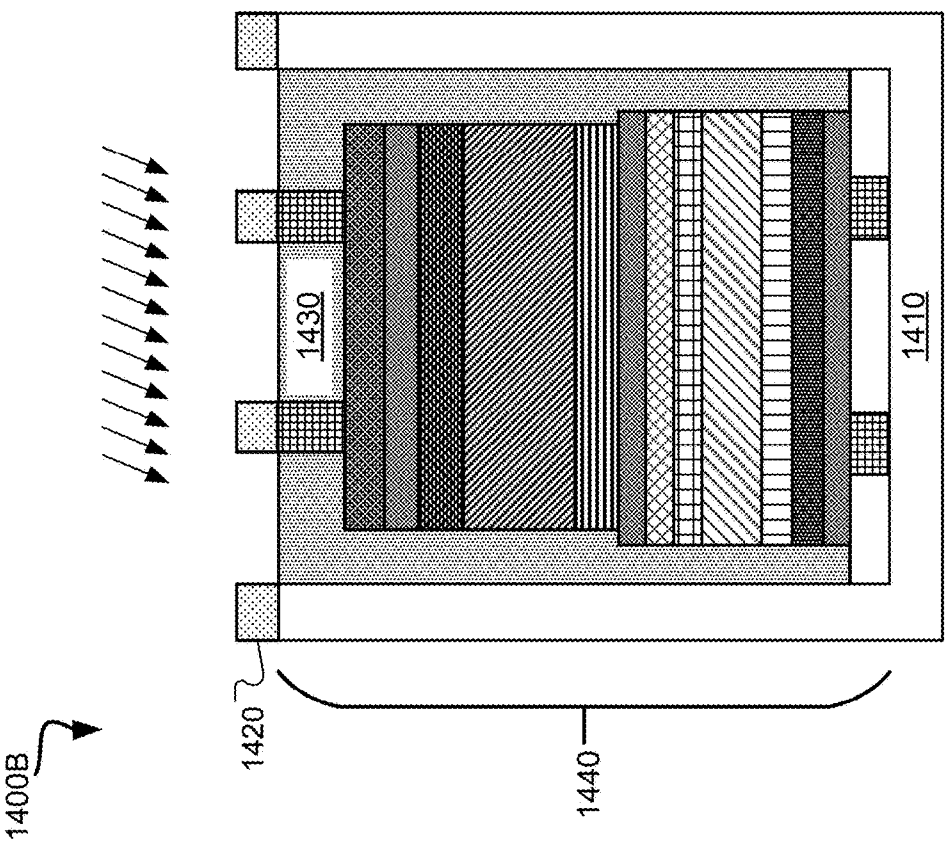
Figure 14A:
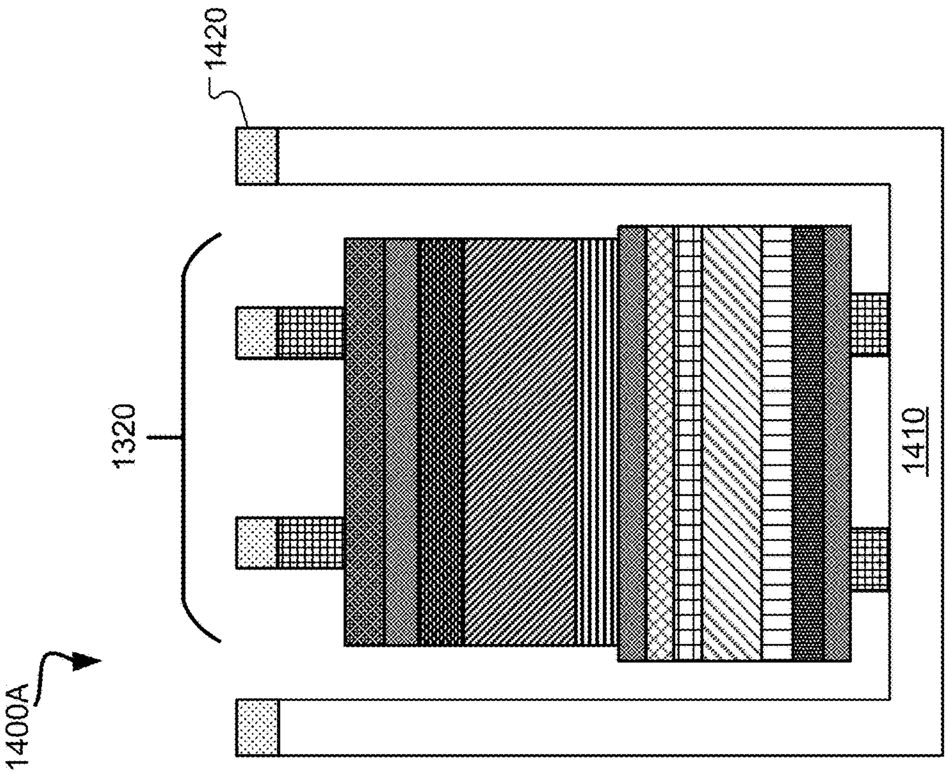

FIGS. 14A-14B are diagrams illustrating the fabrication of a tandem solar cell device using device-level encapsulation during a fifth phase, in accordance with some embodiments. Referring to FIG. 14A, tandem solar cell device 1320 is placed in tray 1410 for processing in a processing chamber capable of performing TFE. In some embodiments, the processing chamber is a CVD chamber. Mask layers 1420 may be placed over electrodes 1310-3 and 1310-4 of tandem solar cell device 1320 and edges of tray 1410. For example, mask layers 1420 can correspond to mask layers 430 of FIG. 4B. Referring to FIG. 14B, encapsulation layer 1430 is deposited to encapsulate the top and/or sides of tandem solar cell device 1320, resulting in encapsulated device 1440. For example, encapsulation layer 1430 can correspond to encapsulation layer 120 of FIG. 1 or encapsulation layer 440 of FIG. 4. Mask layers 1420 can then be removed and encapsulated device 1440 can be taken out of tray 1410. In some embodiments, encapsulated device 1440 is placed within a module including a plurality of tandem solar cell devices (e.g., as shown in FIGS. 2-3).

Figure 15:
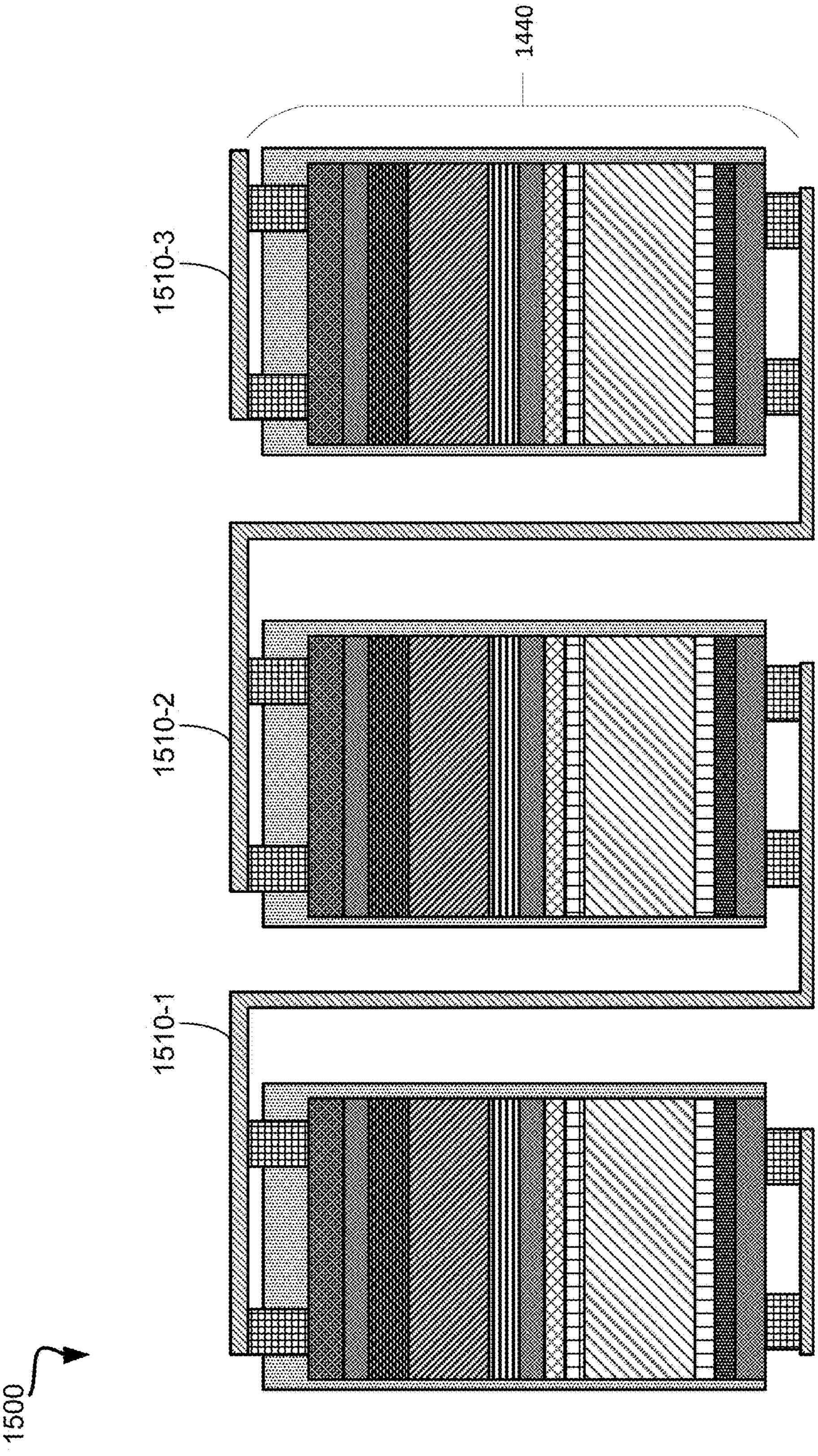

FIG. 15 is diagram illustrating an example module 1500 including tandem solar cell devices formed using device-level encapsulation, in accordance with some embodiments. As shown, module 1500A can include multiple tandem solar cell devices including tandem solar cell device 1440 described above with reference to FIG. 14B. Although three tandem solar cell devices are shown in FIG. 15, module 1500 can include any suitable number of tandem solar cell devices.

Device-level encapsulation layers are formed as separate encapsulation layers on respective tandem solar cell devices. In some embodiments, the multiple device-level encapsulation layers are formed simultaneously during a deposition process (e.g. TFE process). In some embodiments, at least one device-level encapsulation layer is formed during a separate deposition process. As further shown, electrical connections including electrical connections 1510-1 through 1510-3 can be formed in contact with respective electrodes to obtain base module to electrically connect adjacent tandem solar cell devices ones of the tandem solar cell devices of module 1500. Module 1500 can be encapsulated using module-level encapsulation, as described above with reference to FIGS. 3 and 8B. Further details regarding the method of fabricating device module 1500 are described above with reference to FIGS. 1-8B and 10A-14B.

Figure 16:
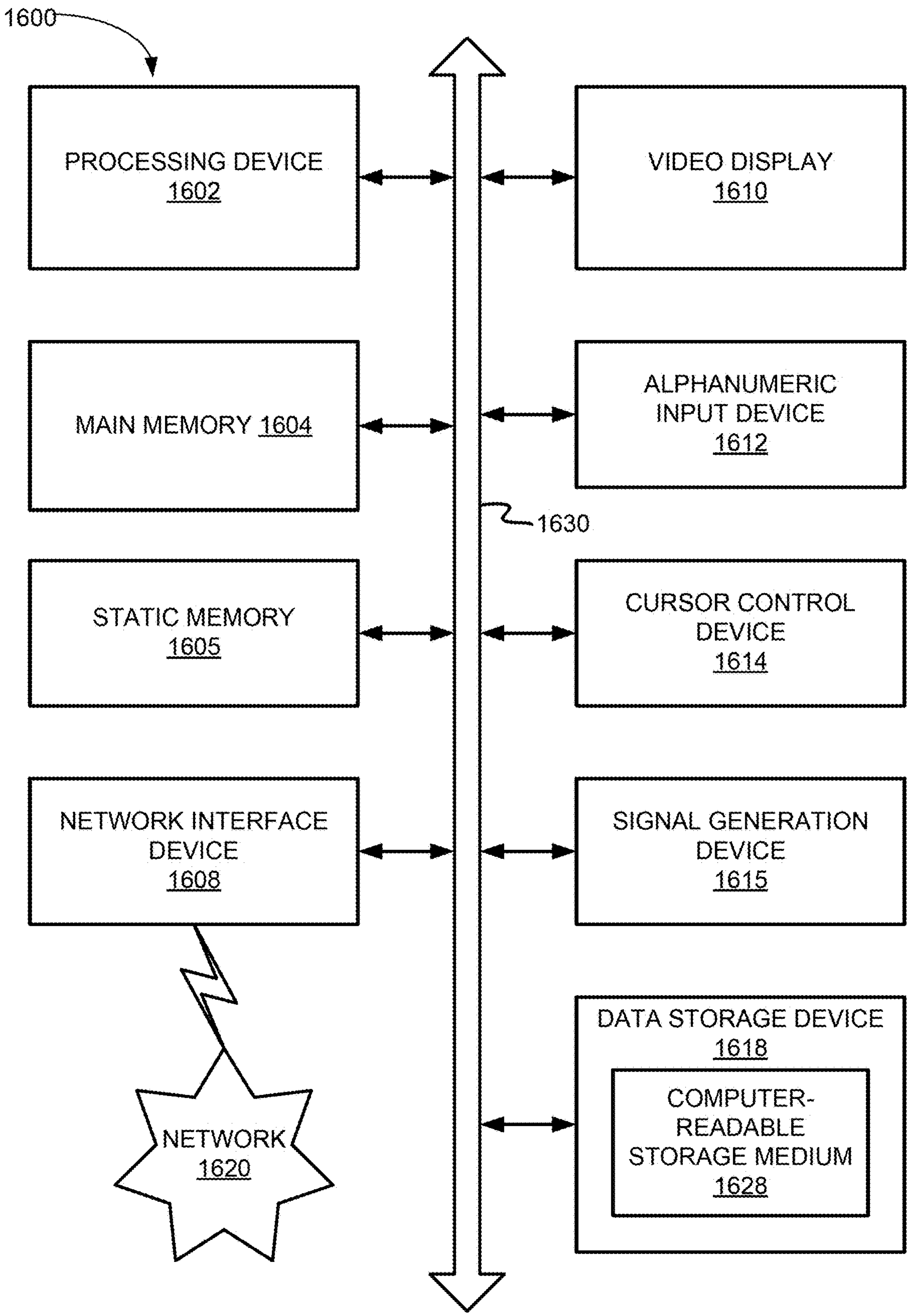
FIG. 16 is a block diagram of an example computer system in which implementations of the present disclosure may operate.

FIG. 16 illustrates a diagrammatic representation of an example computer system 1600, which may be employed for implementing the methods described herein. Computer system 1600 may be connected to other computing devices in a LAN, an intranet, an extranet, and/or the Internet. Computer system 1600 may operate in the capacity of a server machine in a client-server network environment. Computer system 1600 may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computer system" shall also be taken to include any collection of computing devices that individually or jointly execute a set (or multiple sets) of instructions to perform the methods discussed herein. In illustrative examples, computer system 1600 may represent controller 720 of FIG. 7.

Computer system 1600 may include processing device 1602, main memory 1604 (e.g., synchronous dynamic random access memory (DRAM), read-only memory (ROM)), and static memory 1605 (e.g., flash memory and data storage device 1618), which may communicate with each other via bus 1630.

Processing device 1602 may be provided by one or more general-purpose processing devices such as a microprocessor, central processing unit, or the like. In an illustrative example, the processing device 1602 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 1602 may also comprise one or more special-purpose processing devices such as an application specific integrated circuit (ASIC), a field programmable gate array (FPGA), a digital signal processor (DSP), a network processor, or the like. Processing device 1602 may be configured to execute methods of managing computing systems, in accordance with one or more aspects of the present disclosure.

Computer system 1600 may further include a network interface device 1608, which may communicate with network 1620. Computer system 1600 also may include video display unit 1610 (e.g., a liquid crystal display (LCD) or a cathode ray tube (CRT)), alphanumeric input device 1612 (e.g., a keyboard), cursor control device 1614 (e.g., a mouse) and/or an acoustic signal generation device 1615 (e.g., a speaker). In one embodiment, video display unit 1610, alphanumeric input device 1612, and cursor control device 1614 may be combined into a single component or device (e.g., an LCD touch screen).

Data storage device 1618 may include computer-readable storage medium 1628 on which may be stored one or more sets of instructions (e.g., instructions of the methods of automated review of communications, in accordance with one or more aspects of the present disclosure) implementing any one or more of the methods or functions described herein. The instructions may also reside, completely or at least partially, within main memory 1604 and/or within processing device 1602 during execution thereof by computer system 1600, main memory 1604 and processing device 1602 also constituting computer-readable media. The instructions may further be transmitted or received over a network 1620 via network interface device 1608.

While computer-readable storage medium 1628 is shown in an illustrative example to be a single medium, the term "computer-readable storage medium" shall be taken to include a single medium or multiple media (e.g., a centralized or distributed database and/or associated caches and servers) that store one or more sets of instructions. The term "computer-readable storage medium" shall also be taken to include any medium that is capable of storing, encoding or carrying a set of instructions for execution by the machine and that causes the machine to perform the methods described herein. The term "computer-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:

obtaining a set of tandem solar cell devices, wherein each tandem solar cell device of the set of tandem solar cell devices comprises a heterojunction solar cell, a perovskite solar cell disposed on the heterojunction solar cell, a first set of electrodes disposed on the heterojunction solar cell, and a second set of electrodes disposed on the perovskite solar cell;

wherein the heterojunction solar cell comprises a stack of alternating semiconductor layers disposed on a transparent conductive oxide layer; and wherein the perovskite solar cell comprises an electron transport layer disposed on a perovskite layer; and forming, on each tandem solar cell device of the set of tandem solar cell devices using a deposition process, a discrete encapsulation layer that is disposed along an exterior upper surface of the perovskite solar cell, exterior side surfaces of the tandem solar cell device, and in between a first electrode of the second set of electrodes and a second electrode of the second set of electrodes, wherein forming the discrete encapsulation layer comprises:

forming a respective mask layer on each electrode of the second set of electrodes;

initiating the deposition process after forming the respective mask layer on each electrode of the second set of electrodes; and removing the respective mask layer from each electrode after forming the discrete encapsulation layer.

2. The method of claim 1, wherein the deposition process is a chemical vapor deposition (CVD) process.

3. The method of claim 1, wherein the deposition process is a thin film encapsulation (TFE) process.

4. The method of claim 1, wherein the deposition process is performed at a temperature of less than or equal to about 150° C.

5. The method of claim 1, wherein the discrete encapsulation layer comprises at least one of: aluminum oxide, silicon nitride, silicon oxynitride, silicon carbonitride, or hexamethyldisiloxane.

6. The method of claim 1, wherein the set of tandem solar cell devices corresponds to a module, and wherein the method further comprises completing fabrication of the module.

7. The method of claim 6, wherein completing fabrication of the module further comprises performing module-level encapsulation.

8. The method of claim 7, wherein performing module-level encapsulation comprises:

forming an encapsulant on the module; and forming a pair of glass layers on the encapsulant.

9. The method of claim 1, wherein the discrete encapsulation layer has a water vapor transmission rate of less than about $10^{-3}$ g/m$^2$/day.

10. A device, comprising:

a set of tandem solar cell devices, each tandem solar cell device of the set of tandem solar cell devices comprising a heterojunction solar cell, a perovskite solar cell, a recombination layer disposed between the heterojunction solar cell and the perovskite solar cell, a first set of electrodes disposed on the heterojunction solar cell, and a second set of electrodes, wherein each electrode of the second set of electrodes has a first surface disposed on the perovskite solar cell and a second surface opposite the first surface;

wherein the heterojunction solar cell comprises a stack of alternating semiconductor layers disposed on a transparent conductive oxide (TCO) layer;

wherein the perovskite solar cell comprises an electron transport layer (ETL) disposed on a perovskite layer; and for each tandem solar cell device of the set of tandem solar cell devices, a discrete encapsulation layer disposed:

on an exterior upper surface of the perovskite solar cell;

on exterior side surfaces of the perovskite solar cell, the heterojunction solar cell, the recombination layer, and each electrode of the second set of electrodes; and within a region defined in between a first electrode of the second set of electrodes and a second electrode of the second set of electrodes and the exterior upper surface of the perovskite solar cell, wherein the second surface of each electrode of the second set of electrodes is exposed through the discrete encapsulation layer.

11. The device of claim 10, wherein the discrete encapsulation layer has a water vapor transmission rate of less than about $10^{-3}$ g/m$^2$/day.

12. The device of claim 10, wherein the discrete encapsulation layer comprises at least one of: aluminum oxide, silicon nitride, silicon oxynitride, silicon carbonitride, or hexamethyldisiloxane.

13. The device of claim 10, wherein the set of tandem solar cell devices is a plurality of tandem solar cell devices comprised within a module.

14. The device of claim 13, further comprising module-level encapsulation comprising:

an encapsulant disposed on the module; and a pair of glass layers disposed on the encapsulant.

* * * * *